US012738456B2

(12) United States Patent
Kellogg et al.

(10) Patent No.: US 12,738,456 B2
(45) Date of Patent: Sep. 15, 2026

(54) MULTIPLE INPUT SPLIT RING RESONATOR ION BEAM SOURCE

(71) Applicant: FEI Company, Hillsboro, OR (US)

(72) Inventors: Sean M. Kellogg, Portland, OR (US); John Stiller, Beaverton, OR (US); James Hendershot, Grant's Pass, OR (US)

(73) Assignee: FEI Company, Hillsboro, OR (US)

(*) Notice: Subject to any disclaimer, the term of this patent is extended or adjusted under 35 U.S.C. 154(b) by 10 days.

(21) Appl. No.: 18/806,556

(22) Filed: Aug. 15, 2024

(65) Prior Publication Data

US 2026/0051458 A1 Feb. 19, 2026

(51) Int. Cl.
*H01J 37/32* (2006.01)

(52) U.S. Cl.
CPC ...... *H01J 37/32183* (2013.01); *H01J 37/321* (2013.01); *H01J 37/32577* (2013.01); *H01J 37/32642* (2013.01)

(58) Field of Classification Search
CPC .. H01J 37/321; H01J 37/1474; H01J 37/3174; H01J 37/32183; H01J 37/32577; H01J 37/32642; H01J 2237/0432; H01J 2237/1504; H01J 2237/2446
See application file for complete search history.

(56) References Cited

U.S. PATENT DOCUMENTS 5,825,035 A * 10/1998 Mizumura .......... H01J 37/3056 315/111.41
7,531,799 B2 * 5/2009 Kawasaki ............. H01J 37/153 250/311
2004/0164682 A1 8/2004 Hopwood et al.
2014/0363978 A1 * 12/2014 Martin ................ H01J 37/3002 216/61
2016/0203948 A1 * 7/2016 Huynh ............... H10N 60/0884 250/398
2017/0098535 A1 * 4/2017 Ramsey ................ H01J 49/167
2020/0333271 A1 * 10/2020 Hendrich .............. H01J 37/285

OTHER PUBLICATIONS

Alamatsaz et al., "A kinetic study of electron heating and plasma dynamics in microwave microplasmas," American Institute of Physics, Jan. 1, 2019, vol. 26, No. 1.

(Continued)

*Primary Examiner* — Tung X Le
(74) *Attorney, Agent, or Firm* — Leron Vandsburger

(57) ABSTRACT

Embodiments of charged particle beam systems, components, and methods for extracting charged particles from a gas are described. In a first aspect, A charged particle source includes a resonator. The resonator can include a dielectric substrate defining a first side and a second side, the second side opposite the first side. The resonator can include a first conductive layer disposed on the first side. The first conductive layer can be disposed in accordance with a pattern comprising a ring portion. The pattern can define a gap in the ring portion of the first conductive layer. The resonator can also include a second conductive layer disposed on the second side. The charged particle source can also include a source electrode. The source electrode can be disposed proximal to the first side. The source electrode can be offset from the dielectric substrate.

20 Claims, 14 Drawing Sheets

(56) References Cited

OTHER PUBLICATIONS

Berglund et al., "Evaluation of a microplasma source based on a stripline split-ring resonator," Plasma Sources Science and Technology, Oct. 1, 2013, vol. 22, No. 5.
Bilgic et al., "A low-power 2.45 GHz microwave induced helium plasma source at atmospheric pressure based on microstrip technology," Journal of Analytical Atomic Spectrometry, Jan. 1, 2000, vol. 15, No. 6, pp. 579-580.
Choi et al., "Microwave-excited atmospheric-pressure microplasmas based on a coaxial transmission line resonator," Plasma Sources Science and Technology, May 1, 2009, vol. 18, No. 2, pp. 1-8.
Cohick et al., "Weibull analysis of atmospheric pressure plasma generation and evidence for field emission in microwave split-ring resonators," Plasma Sources Science and Technology, Jan. 28, 2020, vol. 29, No. 1, pp. 1-29.
Cohick et al., "Material influence on GHz split-ring resonator plasma ignition performance," Journal of Applied Physics, Oct. 21, 2018, vol. 124, No. 15.
Cohick et al., "A novel, all-dielectric, microwave plasma generator towards development of plasma metamaterials," Applied Physics Express, Nov. 1, 2016, vol. 9, No. 11.
Dextre et al., "Effect of the Split-Ring Resonator width on the Microwave Microplasma Properties," IEEE Transactions on Plasma Science, Feb. 2017, vol. 45, No. 2, pp. 215-222.
Gregorio et al., "Modeling of microplasmas from Ghz to THz," Journal of Applied Physics, Aug. 28, 2015, vol. 118, No. 8.
Hopwood et al., "A microfabricated atmospheric-pressure microplasma source operating in air," Journal of Physics D: Applied Physic, Jun. 7, 2005, vol. 38, No. 11, pp. 1698-1703.
Hopwood et al., "Microplasmas ignited and sustained by microwaves," Plasmas Sources and Technology, Dec. 1, 2014, vol. 117, No. 6.
Hoskinson et al., "Spatially resolved spectroscopy and electrical characterization of microplasmas and switchable microplasmas arrays," Plasma Sources Science and Technology, Feb. 1, 2014, vol. 23, No. 1.
Hoskinson et al., "Gas heating and plasma expansion in pulsed microwave-excited microplasmas," Plasmas Sources Science and Technology, Oct. 1, 2015, vol. 24, No. 5.
Hoskinson et al., "Electrion confinement and heating in microwave-sustained argon microplasmas," Journal of Applied Physics, Apr. 28, 2015, vol. 117, No. 16.
Hoskinson et al., "Low-power microwave-generated helium microplasma for molecular and atomic spectrometry," Journal of Analytical Atomic Spectrometry, Jun. 1, 2011, vol. 26, No. 6, pp. 1258-1264.
Hoskinson et al., "Gas breakdown and plasma impedance in split-ring resonators," European Physics D, Feb. 2016, vol. 70, No. 3, pp. 1-5.
Iza et al., "Split-ring resonator microplasma: microwave model, plasma impedance and power efficiency," Plasma Sources Science and Technology, May 1, 2005, vol. 14, No. 2, pp. 397-406.
Iza et al., "Low-power microwave plasma source based on a microstrip split-ring resonator," IEEE Transaction on Plasma Science, Aug. 2003, vol. 31, No. 4, pp. 782-787.
Iza et al., "Microplasma: Sources, Particle Kinetics, and Biomedical Applications," Plasma Processes and Polymers, Jun. 9, 2008, vol. 5, No. 4, pp. 322-344.
Kourtzanidis K., et al., "Electromagnetic Wave Energy Flow Control with a Tunable and Reconfigurable Coupled Plasma Split-ring Resonator Metamaterial: A Study of Basic Conditions and Configurations," Journal of Applied Physics, American Institute of Physics, May 28, 2016, vol. 119, No. 20, XP012208007, 10 pages.

* cited by examiner

1105
GENERATE MICROWAVE POWER SIGNAL

1110
IGNITE DISCHARGE USING FIRST INPUT POINT

1115
SUSTAIN DISCHARGE USING SECOND INPUT POINT

1120
EXTRACT BEAM OF CHARGED PARTICLES

1125
APPLY OFFSET VOLTAGE TO RF POWER SIGNAL

MULTIPLE INPUT SPLIT RING RESONATOR ION BEAM SOURCE

TECHNICAL FIELD

Embodiments of the present disclosure are directed to charged particle beam systems, as well as algorithms and methods for their operation. In particular, some embodiments are directed toward microwave resonator ion sources for focused ion beam systems.

BACKGROUND

Miniaturized plasma sources are used in a variety of applications, such as in chemical analysis and sterilization. Advantages of miniaturized plasma sources include relatively low power consumption, simple design and fabrication, mechanical robustness, long lifetime, high non-thermal plasma density, and the ability to operate at atmospheric pressure.

Miniaturized plasma sources include those based on microstrip split-ring resonators (MSRRs). Conventional MSRRs include a radio frequency transmission line consisting of a dielectric substrate sandwiched between a metal strip and a metal ground plane. The metal strip is a dipole folded into a circle, with the two ends creating a small gap, across which an electric field can be created. The dipole corresponds to a half-wavelength microwave resonator that also finds applications in antenna design. The dipole is connected to an additional microstrip transmission line, a feed line that supplies it with radio frequency (RF) power.

At resonance, the electric potential at the ends of the dipole is 180° out of phase, enabling the amplitude of the electric field between them to be amplified several orders of magnitude. Hence, with a relatively low input power, a large potential is created across the gap, and this potential is used to ignite and maintain a plasma. In conventional MSRRs, the electric field in the microstrip is mostly confined to the dielectric substrate. However, in the gap of a split-ring resonator, the electric field between the ends of the folded dipole is elevated from the substrate and is concentrated in the plane between the two ends of the strip. In conventional MSRRs ion acceleration and average ion velocity in the plasma is minimized at least in part by using a mean voltage of the RF power signal equal to about 0 V.

Impedance matching is of particular importance in conventional MSRRs, because the characteristic impedance of the resonator depends on geometric factors, such as the spatial offset of the feed line from the center of the dipole, and the quality factor of the microstrip. Further, the impedance properties of conventional MSRRs differ significantly between pre-ignition and post-ignition operating conditions (e.g., in the absence and in the presence of a microplasma discharge, respectively). Typically, well matched conditions are achieved by using dynamic matching circuits with active control systems configured to minimize reflected power received at the power supply, characterized by larger sizes, greater cost, and greater complexity to design and construct.

BRIEF SUMMARY

Embodiments of charged particle beam systems, components, and methods for extracting charged particles from a gas are described. In a first aspect, A charged particle source includes a resonator. The resonator can include a dielectric substrate defining a first side and a second side, the second side opposite the first side. The resonator can include a first conductive layer disposed on the first side, the first conductive layer disposed in accordance with a pattern comprising a ring portion. The pattern can define a gap in the ring portion of the first conductive layer. The pattern can define a first input point in the ring portion at a first fractional position, a, on the ring portion. The pattern can also define a second input point in the ring portion at a second fractional position, B, on the ring portion. The resonator can also include a second conductive layer disposed on the second side. The charged particle source can also include a source electrode. The source electrode can be disposed proximal to the first side. The source electrode can define an aperture. The source electrode can be offset from the first conductive layer. The offset can be defined by a spacer. The spacer can include a dielectric material and/or an insulating material. The spacer can define a conduit. The conduit can form at least part of a fluid delivery coupling. For a given input point in the ring portion, the fractional position can be a ratio of a first path length between the gap and the given input point in a first direction, relative to a second path length between the gap and the given input point in a second direction different from the first direction.

In some embodiments, the charged particle source further includes a radio frequency (RF) power supply, operatively coupled with the resonator. A first conductive path from the RF power supply through the first input point can be well-matched in an absence of a discharge. A second conductive path from the RF power supply through the second input point can be well-matched in a presence of the discharge. Well-matched can refer to a condition of negligible or substantially no reflected power being measured at the RF power supply during operation. The charged particle source can further include control circuitry configured to deliver power from the RF power supply to the first input point or the second input point, based at least in part on an ignition of the discharge between the ring portion and the source electrode. $\beta$ can be less than $\alpha$. The source can be configured to deliver RF power to the ring portion via the first input point in the absence of the discharge and via the second input point in the presence of the discharge.

The control circuitry can include a first diode electrically coupled with the ring portion via the first conductive path and a second diode electrically coupled with the ring portion via the second conductive path. The control circuitry can include a third diode being electrically coupled with the first diode and the first inductor via the first conductive path and a fourth diode being electrically coupled with the second diode and the second inductor via the second conductive path. The first diode, the second diode, the third diode, and/or the fourth diode can be PIN diodes. The first and third diode can be directionally opposed. The second and fourth diodes can be directionally opposed.

The control circuitry can include a DC voltage source electrically coupled with the first conductive path via a first inductor or electrically coupled with the second conductive path via a second inductor. The charged particle source can further include a DC bias tec, electrically coupled with the first conductive layer, the DC bias tee comprising a DC power input and an RF power input and comprising components configuring the DC bias tee to apply a DC bias to an RF power signal, thereby modifying an offset voltage of the RF power signal.

The pattern can further define a third input point on the ring portion, between the first input point and the second input point and at third fractional position, $\gamma$, relative to the gap.

In some embodiments, the source electrode is electrically coupled to a reference voltage common with the second conductive layer. The charged particle source can be operably coupled with a focused ion beam (FIB) column. An extractor electrode can be disposed on a beam axis downstream of the source electrode.

The charged particle source can further include a source assembly. The source assembly can include a fluid delivery coupler, a fluid removal coupler and an electrical coupler. The resonator can be disposed in the source assembly and operably coupled with the electrical coupler. The source electrode can form a part of the source assembly. The charged particle source can further include a vacuum enclosure, an isolating support, disposed in the vacuum enclosure, mechanically coupled with the vacuum enclosure and the source assembly and together defining a source chamber and a FIB chamber, the isolating support including a material having electrically insulating properties up to and including at an applied voltage of about ±300 kV DC. The source chamber can be fluidically coupled with the FIB chamber via a bypass conduit.

In a second aspect, a charged particle beam system, includes a source section. The source section can include a resonator of the first aspect in one or more embodiments. The system can include a focused ion beam (FIB) column, operably coupled with the source section and including multiple charged particle optics. The system can also include a vacuum chamber, operably coupled with the FIB column.

In a third aspect, a charged particle source can include a resonator. The resonator can include a dielectric substrate defining a first side and a second side, the second side opposite the first side. The resonator can include a first conductive layer disposed on the first side, the first conductive layer disposed in accordance with a pattern comprising a ring portion, the ring portion defining a gap in the first conductive layer. The resonator can include a second conductive layer disposed on the second side. The charged particle source can also include a source electrode, disposed proximal to the first side. The source electrode can define an aperture. The source electrode can be offset from the dielectric substrate. The offset can be defined by a spacer. The spacer can include a dielectric material and/or an insulating material. The spacer can define a conduit. The conduit can form at least part of a fluid delivery coupling.

In some embodiments, the charged particle source can further include a radio frequency (RF) power supply, operatively coupled with the resonator and calibrated to match an impedance of a radio-frequency power signal in a presence of a discharge formed between the ring portion and the source electrode.

In some embodiments, the gap can be defined between a first end and a second end of the ring portion. The aperture can be substantially centered with the first end of the ring portion.

The ring portion can be a first ring portion. The gap can be a first gap. The pattern can further include a second ring portion defining a second gap. The charged particle source can include an RF power supply, operatively coupled with the resonator via the first ring portion or the second ring portion. The RF power supply can be configured to provide a first well-matched impedance condition of a first radio-frequency power signal in a presence of a discharge in the first gap. The RF power supply can be configured to provide a second well-matched impedance condition of a second radio-frequency power signal in an absence of the discharge in the second gap. The first gap and the second gap can be proximal to each other.

The ring portion can define a taper, narrowing toward the respective first gap or second gap. The RF power supply can be coupled with the resonator via a switching circuit. The switching circuit can be configured to couple the first ring portion with the RF power supply in the presence of the discharge and to couple the second ring portion with the RF power supply in the absence of the discharge.

In some embodiments, the first ring portion can define a first power injection point. The second ring portion can define a second power injection point. The first gap can be defined in the first ring portion at a first fractional position, a, relative to the first power injection point. The second gap can be defined in the second ring portion at a fractional position, B, relative to the second power injection point. For a given input point in the ring portion, the fractional position can be a ratio of a first path length between the gap and the given input point in a first direction, relative to a second path length between the gap and the given input point in a second direction different from the first direction. The first fractional position, a, and the second fractional position, B, can be substantially equal.

In some embodiments, the charged particle source can further include a DC bias tec, electrically coupled with the first ring portion. The DC bias tee can further include a DC power input and an RF power input. The DC bias tee can include components configuring the DC bias tee to apply a DC bias to an RF power signal, thereby modifying an offset voltage of the RF power signal.

In some embodiments, the source electrode can be electrically coupled to a reference voltage common with the second conductive layer. The source electrode can include a foil coupled with a support, the aperture being formed in the foil. The aperture can be characterized by a diameter from about 20 μm to about 200 μm, including sub-ranges, fractions, and interpolations thereof and an aspect ratio of about 0.05 to about 0.5, including sub-ranges, fractions, and interpolations thereof.

The charged particle source can be operably coupled with a focused ion beam (FIB) column. The FIB column can include an extractor electrode. The resonator can be oriented relative to the extractor electrode such that the source electrode is between the first side and the extractor electrode. In some embodiments, the charged particle source can further include a source assembly. The source assembly can include the source electrode, a fluid delivery coupler, a fluid removal coupler, and an electrical coupler. The resonator can be disposed within the source assembly and operably coupled with the electrical coupler.

In a fourth aspect, a charged particle beam system includes a source section. The source section can include a resonator of the third aspect in one or more embodiments. The system can include a focused ion beam (FIB) column. The FIB column can be operably coupled with the source section and can include multiple charged particle optics. The system can also include a vacuum chamber, operably coupled with the FIB column.

The source section can further include a source assembly. The source assembly can include the dielectric substrate and a housing, coupled with the dielectric substrate. The housing can include the source electrode, a fluid delivery coupler, a fluid removal coupler, and an electrical coupler, operably coupled with the first conductive layer and/or the second conductive layer via the housing.

At least a portion of the housing can be coupled with a voltage source. The voltage source can be configured to apply a voltage from about 1 kV to about 350 kV to the portion of the housing. The FIB column can include an extractor electrode. The source section can be oriented relative to the extractor electrode such that the source electrode is between the first side and the extractor electrode.

In some embodiments, the ring portion can be a first ring portion. The pattern can define a resonant multipole structure including the first ring portion. The resonant multipole structure can include a second ring portion. The first ring portion and the second ring portion can define four gaps between four ends.

In a fifth aspect, an optical spectroscopy source can include a charged particle source of the first aspect in one or more embodiments or the third aspect in one or more embodiments. The optical spectroscopy source can be configured to introduce an analyte to a discharge region between the resonator and the source electrode, and to generate a discharge including the analyte, from which a flux of characteristic photons can be directed from the discharge to a spectrometer. The optical spectrometer can include an input optic, a diffraction optic, and a detector. The optical spectrometer can be configured to decompose the flux of characteristic photons into one or more constituent beams from which OES spectrum data can be generated.

The input optic can include a collimator, one or more lenses, and/or one or more filters. In some embodiments, the input optic can include one or more beam splitters, and/or one or more polarizers. The diffraction optic can include a grating, a mirror, a distributed Bragg reflector (DBR) and/or one or more mechanical elements configured to move the diffraction optic relative to one or more other components of the spectrometer. The detector can include one or more sensors, a traversing sensor, and/or electronics configured to generate the OES spectrum data based at least in part on the flux of characteristic photons.

The analyte can be provided to the discharge region as an atomized vapor, as a gaseous vapor, and/or as a solid. The source can be provided with fluid couplers to introduce and/or remove the analyte from the discharge region. The source can be configured to operate at or near atmospheric pressure, under vacuum, and/or at a pressure above atmospheric pressure. In some cases, the operating pressure can be based at least in part on the analyte being processed and corresponding discharge properties.

The gap can be defined in the first conducting layer. The gap can be substantially oriented with respect to the source electrode such that the photon flux emanating from the discharge is transmitted from the source to the input optic of the spectrometer. To that end, the source electrode can be or include a material that is substantially transparent to photons in a given spectral range and electrically conducting. The source electrode can include indium tin oxide (ITO). The source can include a transparent portion.

In a sixth aspect, an optical spectroscopy source can include a charged particle source of the first aspect in one or more embodiments or the third aspect in one or more embodiments. The optical spectroscopy source can be configured as a sealed light source. The optical spectroscopy source can be calibrated for use as a light source for Optical Absorption Spectroscopy (OAS) applications, and to generate a discharge including the analyte, from which a flux of characteristic photons can be directed from the discharge to a spectrometer. The optical spectrometer can include an input optic, a diffraction optic, and a detector. The OAS system can be configured to pass a test beam of photons through an analyte cell and a reference beam of photons through a reference cell, as part of an OAS procedure. The test beam and the reference beam can be prepared using optics including a collimator, a beam splitter optic, a mirror, and/or a partially transmissive mirror. One or more optics can be coupled with movable components. The moveable components can include a motorized turret, a stepper motor, or the like. The characteristic photons can include photons in the ultraviolet energy range and/or in the visible energy range. The source can be configured to generate a discharge that favors emission of photons in the ultraviolet and/or visible spectral ranges.

In a seventh aspect, a volumetric plasma system includes a charged particle source of the first aspect in one or more embodiments or the third aspect in one or more embodiments. The volumetric plasma system can include a load lock chamber. The load lock chamber can be coupled with a vacuum chamber of a charged particle beam system. The load lock chamber can be reversibly isolated from the vacuum chamber. The load lock chamber can be reversibly isolated from the vacuum chamber by a movable valve. The valve can be a gate valve. The charged particle source can be disposed in the load lock chamber. The charged particle source can be disposed in the vacuum chamber. A sample stage of the charged particle beam system can be configured to have a movement range extending across the load lock chamber. The sample stage can be configured to have a movement range extending across the load lock chamber across the vacuum chamber. The sample stage can be electrically coupled with a voltage source and can serve as at least part of the source electrode. The source electrode can include a substrate. The substrate can be electrically conducting. The substrate can be electrically coupled with the voltage source via the sample stage. The substrate can be coupled with one or more sample manipulation tools. The sample manipulation tools can be coupled with one or more controls via a vacuum feedthrough. The sample manipulation tools can be configured to couple the substrate with the sample stage.

The terms and expressions which have been employed are used as terms of description and not of limitation, and there is no intention in the use of such terms and expressions of excluding any equivalents of the features shown and described or portions thereof, but it is recognized that various modifications are possible within the scope of the claimed subject matter. Thus, it should be understood that although the present claimed subject matter has been specifically disclosed by embodiments and optional features, modification and variation of the concepts herein disclosed can be resorted to by those skilled in the art, and that such modifications and variations are considered to be within the scope of this disclosure as defined by the appended claims. For example, the preceding aspects and various embodiments can be combined with one or more other aspects and/or embodiments of the same or other aspects.

BRIEF DESCRIPTION OF THE SEVERAL VIEWS OF THE DRAWINGS

The foregoing aspects and many of the attendant advantages of the present disclosure will become more readily appreciated as the same become better understood by reference to the following detailed description, when taken in conjunction with the accompanying drawings.

Figure 1:
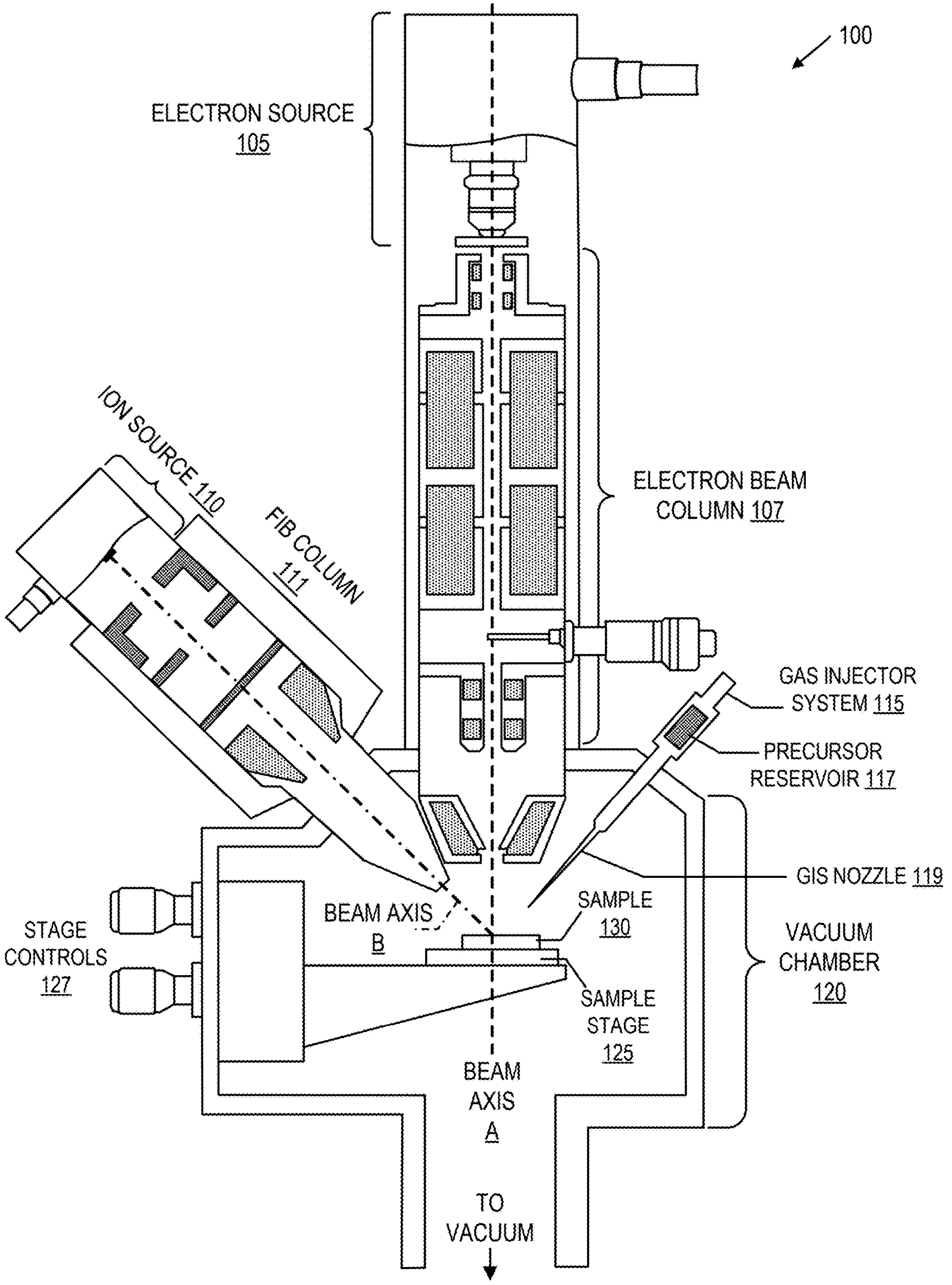
FIG. 1 is a schematic diagram illustrating an example dual-beam system, in accordance with some embodiments of the present disclosure.

In the drawings, like reference numerals refer to like parts throughout the various views unless otherwise specified. Not all instances of an element are necessarily labeled to reduce clutter in the drawings where appropriate. The drawings are not necessarily to scale, emphasis instead being placed upon illustrating the principles being described.

DETAILED DESCRIPTION

While specific embodiments have been illustrated and described, it will be appreciated that various changes can be made therein without departing from the spirit and scope of the disclosure. In the forthcoming paragraphs, embodiments of charged particle beam systems, components, and methods for extracting ions from a gas are described. Embodiments of the present disclosure focus on techniques for improved matching and control in different discharge regimes, applied in focused ion beam (FIB) instruments, in the interest of simplicity of description. To that end, embodiments are not limited to such systems, but rather are contemplated for analytical instrument systems where extracting charged particles from a relatively small volume of gas can present technical challenges. In an illustrative example, FIB sources can benefit from miniaturization and circuit design to improve transitions from pre-ignition mode to discharge mode, without the use of dynamic matching circuits. Similarly, miniature discharge systems of the present disclosure can be integrated into optical emission systems, into sample loading and preparation components (e.g., load-lock chambers), or the like. While embodiments of the present disclosure focus on dual-beam FIB-SEM systems, additional and/or alternative systems are contemplated, including but not limited to single-beam FIB systems, portable ion sources, and optical emission systems for which a micro-discharge can serve as a light source.

Embodiments of the present disclosure include systems, methods, algorithms, and non-transitory media storing computer-readable instructions for extracting ions from a discharge, using a split ring resonator-type plasma source. In an illustrative example, a charged particle source system can include a resonator. The resonator can include a dielectric substrate defining a first side and a second side. The second side can be opposite the first side. The resonator can include a first conductive layer disposed on the first side. The first conductive layer can be disposed in accordance with a pattern comprising a ring portion. The ring portion can define a gap in the first conductive layer. The resonator can also include a second conductive layer disposed on the second side. The source system can also include a source electrode. The source electrode can be disposed proximal to the first side. The source electrode can define an aperture. The source electrode can be offset from the first conductive layer. Embodiments of the present disclosure include multiple power input points on a single ring portion, multiple ring portions providing multiple gaps, bias circuits to apply offset voltages to an alternating current power signal (e.g., an RF power signal), and multipole structures configured to reduce or substantially eliminate thermalization of ions in the gap(s). In this way, split ring resonator sources of the present disclosure can serve as tunable ion sources in charged particle beam systems and other analytical instrument systems, while also providing well-matched impedance conditions both in the presence of a discharge and in the absence of the discharge, without relying on dynamic impedance matching circuits.

FIG. 1 is a schematic diagram illustrating an example dual-beam system 100, in accordance with some embodiments of the present disclosure. The example system 100 includes an electron source 105, an electron beam column 107, an ion source 110, a focused ion beam ("FIB") column 111, a gas injection system ("GIS") 115, a vacuum chamber 120, and a sample stage 125. The electron beam column 107 is illustrated as a scanning electron microscope (SEM) column, such that the example system 100 corresponds to a dual beam FIB-SEM system. The electron beam column 107, the FIB column 111, and the GIS 115 are illustrated as being operably coupled with the vacuum chamber 120, with the electron beam column 107 defining a first beam axis A and the FIB column 111 defining a second beam axis B. The axes A and B are illustrated converging onto a region of a sample 130, with the GIS 115 oriented toward the region of the sample 130 and configured to direct a gas stream including a precursor into the vacuum chamber. Advantageously, while axes A and B can also be oriented toward different locations, convergence permits the SEM system to image the region of the sample being processed by the FIB.

The electron source 105 can include one or more emitters configured to generate free electrons and to direct the electrons into the electron beam column 107. The emitters can include thermionic emitters, Schottky emitters, field-emission source emitters, or combinations thereof, operably coupled to power systems configured to apply a high-voltage (e.g., on the order of kilovolts to hundreds of kilovolts) to an emission region of the emitter material. For example, the electron source 105 can include a lanthanum hexaboride ($LaB_6$) emitter crystal to which a high electrical potential is applied to elicit the emission of electrons from a tip of the emitter crystal. In this way, a beam of electrons can be directed into the electron beam column 107.

The electron beam column 107 includes electromagnetic optics (e.g., electrostatic lenses, electromagnetic lenses, monochromators, aberration correctors, etc.) and apertures configured to shape, focus, defocus, narrow, and/or direct the beam of electrons such that the beam is focused onto the sample 130, in accordance with a set of operating parameters. The operating parameters can include a beam current, a beam energy (e.g., in volts, in electron volts, or the like), a magnification parameter, a scan pattern, a dwell time, and/or one or more pulse parameters. In this way, the example system 100 can function as an SEM to image portions of the sample 130 and/or can be used for e-beam assisted deposition of material onto the sample 130 (e.g., in coordination with the GIS 115) or other sample modifications.

The ion source 110 can include one or more components configured to generate a beam of ions and to direct the ions into the FIB column 111. In general, the ions can include metal ions and/or nonmetal ions (e.g., noble gas, halogen, oxygen, nitrogen, or the like). To that end, the ion source 110 can include a plasma source (e.g., an inductively coupled plasma source or a microplasma source of the present disclosure) and/or a metal ion source (e.g., a liquid-metal ion source). In the context of the present disclosure, atomic and/or molecular gases and their mixtures can serve as plasma precursor gases, from which a stream of ions can be extracted. To that end, embodiments of the present disclosure are directed at systems, components, and methods for igniting and sustaining plasma discharges, and can include associated techniques for extracting ions from the plasma discharges. In some embodiments, the ion source 110 includes a microwave resonator circuit configured to provide well-matched conditions in one or more discharge modes in the presence of a plasma discharge and/or in the absence of a plasma discharge. Embodiments of the microwave resonator circuits of the present disclosure and their operation are described in more detail in reference to FIGS. 2A-11.

As with the electron beam column 107, the FIB column 111 can include electromagnetic optics (e.g., electrostatic lenses, electromagnetic lenses, monochromators, etc.) and apertures configured to shape, focus, defocus, narrow, and direct the beam of ions such that the beam is focused onto the sample 130, in accordance with a set of operating parameters. The operating parameters can include a beam current, a beam energy (e.g., in volts, in electron volts, or the like), a magnification parameter, a scan pattern, a dwell time, and/or one or more pulse parameters. In this way, the example system 100 can function as a FIB to modify portions of the sample 130 and/or to be used for ion-beam assisted removal of material from and/or deposition of material onto the sample 130 (e.g., in coordination with the GIS 115).

Analogous to the energies described in reference to the electron beam, above, the ion beam energy can be selected (e.g., by a user, by an algorithm initiated by a user, and/or automatically without user intervention). In some embodiments, additional and/or alternative precursor decomposition mechanisms (e.g., surface activation and/or secondary electron reemission) can be used as a mechanism for precursor decomposition, thereby allowing the ion beam energy to be determined based at least in part on a relationship between beam energy, sample material properties, and the energetic characteristics of the precursor deposition reaction mechanism. Advantageously, ion beam-induced deposition can elicit relatively high yields, in comparison to electron beam-induced deposition, based at least in part on the combined effect of multiple energy transfer pathways.

The GIS 115 includes constituent elements that together permit the GIS 115 to generate a gas stream including the precursor and to direct the gas stream into the vacuum chamber. The components of the GIS 115 can include a carrier gas inlet, a nozzle 119, and a conduit fluidically coupling the nozzle 119 and a precursor reservoir 117. The precursor reservoir 117 can include a substantially non-reactive container (e.g., a ceramic crucible, PTFE enclosure, a non-reactive metal or alloy, or the like) that is at least partially exposed to the conduit. In this way, vapor generated from a precursor disposed in the precursor reservoir 117 can be directed toward the nozzle and into the vacuum chamber (e.g., by pressure-driven flow induced by a pressure gradient relative to the vacuum of the vacuum chamber). In some embodiments, the GIS 115 includes a carrier gas inlet, fluidically coupled with the nozzle 119 via the conduit. In this way, the precursor can be entrained in a flow of carrier gas and directed toward the nozzle and into the vacuum chamber. Additionally and/or alternatively, the precursor can include a gas at standard conditions and can be introduced to the GIS 115 via a gas inlet provided as part of the GIS 115.

The operation of one or more components of the example system 100 can be coordinated by control circuitry, in accordance with machine-executable instructions (e.g., software, firmware, etc.) that can be stored in machine-readable storage media and/or received from external systems via wired and/or wireless communication techniques (e.g., over a WiFi or Bluetooth link). To that end, components of the example system 100 can be automated (e.g., operating without human intervention), pseudo-automated (e.g., operating with limited human intervention to initiate operations, analyze output and confirm, or the like), or manually operated (e.g., where individual operations of the example system 100 are performed and/or coordinated by a human user). In an illustrative example, the sample stage 125 can be mechanically coupled with automated stage controls 127 that permit the sample 130 to be reversibly tilted relative to the beam axes A and B, such that the surface of the sample is oriented at a particular angle relative to a given beam axis during operation of the corresponding charged particle beam source. In this way, the operation of a given beam source can be coordinated with the operation of the stage controls 127. In another example, detectors provided as part of the example system 100 can be integrated into a control system that is configured to manipulate one or more operating parameters of the ion source 110, as part of a control scheme to maintain a set point for the beam brightness, as described in more detail in reference to FIG. 11.

Some embodiments of the present disclosure omit one or more components of example system 100. For example, one or more of the sources 105 and 110 and/or columns 107 and 111 can be omitted. In an illustrative example, an single-beam FIB system can be configured to perform operations for generating a beam of ions. Similarly, a multi-beam FIB system other than a dual-beam FIB-SEM (e.g., a FIB-Laser system or a FIB-SEM system for which two or more beam axes are not convergently trained on a given region of the sample 130) can include the charged particle sources of the present disclosure.

Figure 2A:
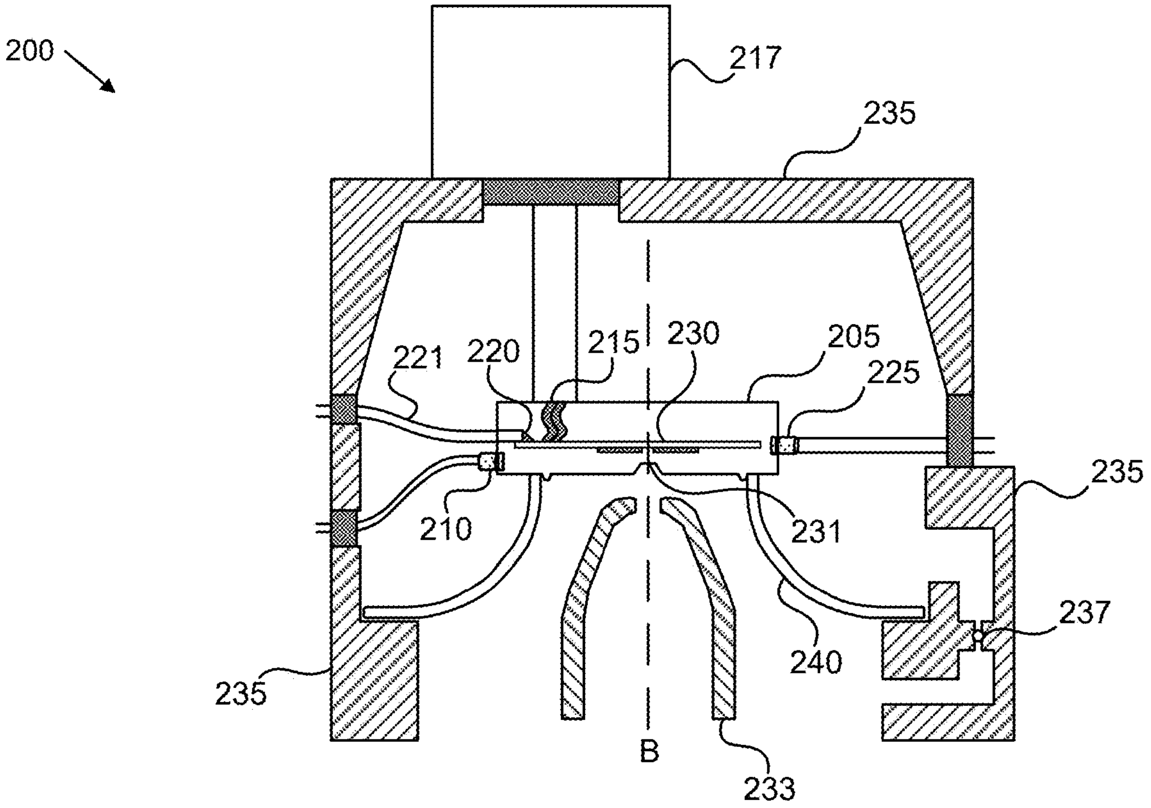
FIG. 2A is a schematic diagram illustrating an example ion source, in accordance with some embodiments of the present disclosure.

FIG. 2A is a schematic diagram illustrating an example ion source 200, in accordance with some embodiments of the present disclosure. In the forthcoming description, example ion source 200 is also referred to as an "inverted" design, in reference to the relative position of active components of the ion source and those of the FIB column (e.g., FIB column 111 of FIG. 1). To that end, example ion source 200 can be an example of the ion source(s) 110 of FIG. 1 and can be configured to operate as part of the example system 100 of FIG. 1. Example ion source 200 includes a source assembly 205, a fluid delivery coupler 210, an electrical coupler 215, an optical coupler 220, and a fluid removal coupler 225. The source assembly 205 includes a resonator 230. The example ion source 200 can include a vacuum enclosure 235 configured to maintain a vacuum environment around the source assembly 205, an isolating support 240, and a bypass conduit 237. The example ion source 200 can include a source electrode 231, an extractor electrode 233, and one or more power circuits 217. In some embodiments, the extractor electrode 233 is a component of the FIB column, and is introduced into the vacuum environment via a coupling of the vacuum enclosure 235 with the FIB column.

FIG. 2A represents a cross-sectional view of the example ion source 200. To that end, some of the components of the example ion source 200 are at least partially rotationally symmetric about an axis B (e.g., second axis B of FIG. 1). Other components are not rotationally symmetric. For example, the isolating support 240 can be a solid of rotation having a truncated horn shape. As illustrated in reference to FIG. 2B, the source assembly 205 can be substantially symmetric about the axis B, as well, but can also assume other form factors, for example, as may be informed by constraints of the vacuum enclosure 235.

The various couplers 210, 215, 220, and 225 can be configured to supply material, energy, and diagnostic capabilities to the source assembly 205. For example, the fluid delivery coupler 210 and fluid removal coupler 225 can be coupled with fluid handling conduits (e.g., gas-vacuum feedthroughs, liquid/vapor coolant feedthroughs, etc.) and configured to deliver a fluid to a vicinity of the resonator 230, as described in more detail in reference to FIGS. 3A-11. In this context, the term "fluid" can refer to a gas, liquid, or other phases characterized by a tendency to flow from a region of relatively high pressure to a region of relatively low pressure, or by other mechanisms (e.g., molecular flow regimes). To that end, the fluid can be or include a volatilized precursor that is entrained in a carrier gas (e.g., a vapor) or a vapor flow without a carrier gas. Embodiments of the present disclosure include multiple fluid delivery couplers 210 and fluid removal couplers 225 dedicated to different purposes. For example, one pair of couplers be configured to provide plasma precursor fluid (e.g., a gas mixture, vapor mixture, etc.) for the resonator 230, and a second pair can be coupled with one or more cooling loops to remove heat from the resonator 230 (e.g., using a liquid coolant).

In some embodiments, the fluid delivery coupler 210 includes a feedthrough 221 that is configured to fluidically couple a relatively high pressure environment in a vicinity of the resonator 230 with a fluid supply system, external to the vacuum enclosure 235. As an example, the feedthrough 221 can be or include a capillary tube or other conduit that permits a plasma precursor to be delivered to the relatively high pressure area near the resonator. Similarly, the fluid removal coupler 225 can be coupled with a vacuum system to enable evacuation of the precursor from the vicinity of the resonator 230 to a relatively higher vacuum environment and/or to maintain pressure at the outlet of the source assembly 205. In this way, the fluid provided to the relatively high pressure environment in the vicinity the resonator 230 (e.g., the discharge region) is preferentially drawn to the fluid removal coupler 225 rather than into the vacuum environment of the FIB system (e.g., through the aperture 265 of FIG. 2B).

The resonator 230 can be electrically coupled with the power circuit(s) 217 via the electrical coupler 215. As described in more detail in reference to FIGS. 4A-10C, the power circuit(s) can include a radio frequency (RF) alternating current (AC) power supply and/or a direct current (DC) power supply. In an illustrative example, the source assembly 205 can include a microwave amplifier and a DC bias circuit. The microwave amplifier can draw from about 0.5 Watts to about 30 Watts, including sub-ranges, fractions, and interpolations thereof. The power drawn by the microwave amplifier can be based at least in part on operating parameters of the plasma source (e.g., power delivery to the plasma). In some embodiments, control circuitry (e.g., a microcontroller coupled with the power circuits) and the DC bias supply together are configured to draw from about 0.1 Watts to about 10 Watts, including sub-ranges, fractions, and interpolations thereof.

To facilitate the operation of the resonator 230 as a RF plasma source, one or more forms of RF shielding (e.g., faraday shielding) can be provided to protect electrical components of the example ion source 200 from electromagnetic interference (EMI). For example, the electrical coupler 215 and the RF power supply and/or components of the resonator (e.g., electronic components provided on the resonator board illustrated in FIGS. 7C, 8B, and 9C) can be shielded. Such shielding can also serve to reduce interference between DC components of the example ion source 200, such as the source electrode 231 and/or the DC power circuit, as described in more detail in reference to FIGS. 6A-6C.

In some embodiments, the source assembly 205 is shaped to receive the isolating support 240 such that electrically active elements of the example ion source 200 are screened from a triple-junction point formed between the isolating support 240, the source assembly 205, and the surrounding vacuum environment. Without being bound to a particular physical mechanism or explanation, shielding the triple junction point in this way can reduce the likelihood of electron surface flashover or other modes of electrical breakdown that can occur when grounded surfaces are separated from energized surfaces by an electrical insulator. In the context of the present disclosure, the relatively high voltages applied to the source electrode 231 and/or the extractor electrode 233 can be screened from the isolating support 240 at the point where the isolating support 240 meets the source assembly 205. The shapes can include ridges, ribs, baffles, or other shapes to physically screen energized components of the example ion source 200 from grounded portions of the example ion source 200.

The source assembly 205 can include a housing, such as an enclosure provided with couplings for the various inputs and outputs (e.g., fluidic, optical, electrical, etc.) that at least partially isolates a relatively high pressure environment in a vicinity of the resonator, relative to the vacuum environment around the source assembly 205. To that end, the resonator 230 can be disposed at least partially within the housing of the source assembly 205, but can also serve as a part of the housing, for example, where a support or substrate of the resonator 230 separates the relatively high pressure environment from the vacuum environment (e.g., in an "inverted" design, illustrated in FIG. 3B). As described in more detail in reference to FIGS. 2B-3B, the source assembly 205 can include a spacer disposed between the resonator 230 and the source electrode 231, such that the various conduits and couplers described in reference to FIG. 2A can be disposed in a spacer or in the resonator 230, as opposed to a distinct housing in which the resonator 230 is also disposed.

Figure 2B:
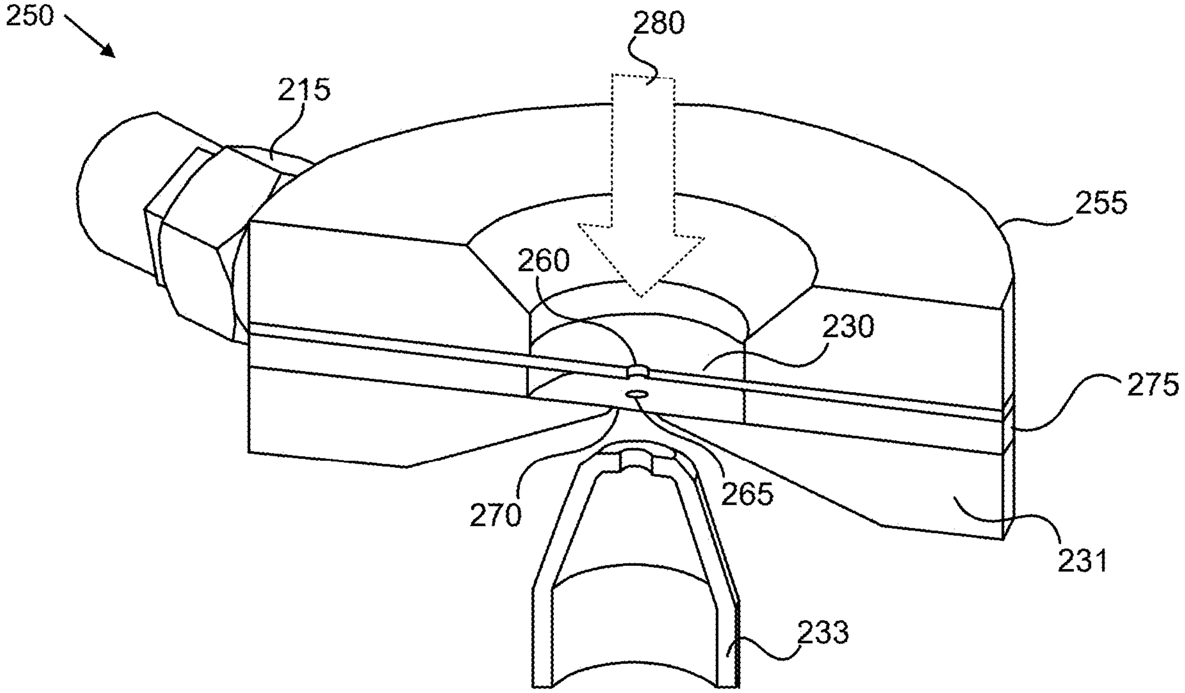
FIG. 2B is a schematic diagram illustrating an example source assembly, in accordance with some embodiments of the present disclosure.

FIG. 2B is a schematic diagram illustrating an example source assembly 250, in accordance with some embodiments of the present disclosure. The example source assembly 250 is an embodiment of the source assembly 205 of FIG. 2A. Example source assembly 250 includes the electrical coupler 215 (e.g., as a shielded coaxial coupling), the resonator 230, and the source electrode 231, disposed at least partially within a shielded housing 255. Example source assembly 250 includes a spacer 275, disposed between the resonator 230 and the source electrode 231. The configuration shown in FIG. 2B is referred to as a "suspended" design for the source assembly 205, in contrast to the "inverted" design of FIG. 2A, which is described further in reference to FIG. 3A.

The extractor electrode 233 is shown in substantial alignment with features of the source assembly 250 that together at least partially define an axis (e.g., axis B of FIG. 2A) as described in reference to FIG. 2A. For example, the resonator 230 can define an aperture 260 that can serve as the fluid delivery coupler 210. To that end, embodiments of the present disclosure include a relatively high pressure region external to the source assembly 250 that drives a flow 280 of plasma precursor gas into a discharge region between the resonator 230 and the source electrode.

The source electrode 231 can define a charged particle extraction aperture 265, positioned relative to the extractor electrode 233 such that an extraction field emanating from the extractor electrode can draw charged particles (e.g., positive ions, negative ions, etc.) from a plasma generated in the discharge region into the FIB column. The extraction aperture 265 can be defined in a foil 270 at least partially fused with or formed from a bulk material of the source electrode 231. To that end, the source electrode 231 can include one, two, or more materials electrically coupled with each other (e.g., through welding or other techniques).

The aperture 265 can be characterized by a diameter from about 20 μm to about 200 μm, including sub-ranges, fractions, and interpolations thereof and an aspect ratio of about 0.05 to about 0.5, including sub-ranges, fractions, and interpolations thereof. In general, the diameter of the aperture 265 can depend at least in part on the beam current of the source. With higher beam current, a larger aperture can be defined in the source electrode 231.

Advantageously, including the foil 270 as part of the source electrode permits the extraction aperture 265 to have a smaller diameter for a given aspect ratio, which, in turn, can improve brightness and reduce the flow rate of neutral particles (e.g., vapor particles, gas particles, etc.) into the vacuum environment via the extraction aperture 265. Further, a relatively small aspect ratio can reduce the likelihood of ion recombination on conductive surfaces of the extraction aperture 265, in circumstances where a mean free path of ions in a vacuum environment can be larger than the diameter of the extraction aperture 265.

The spacer 275 can be or include a substantially insulating and/or dielectric material configured to offset the resonator 230 from the source electrode 231, thereby defining the discharge volume from which charged particles can be extracted toward the FIB column. In some embodiments, the spacer 275 can be omitted, with the offset between the resonator 230 and one or more components of the source electrode 231 (e.g., the foil 270) being defined by one or more retention elements, such as the housing 255 and the isolating support 240.

Figure 3A:
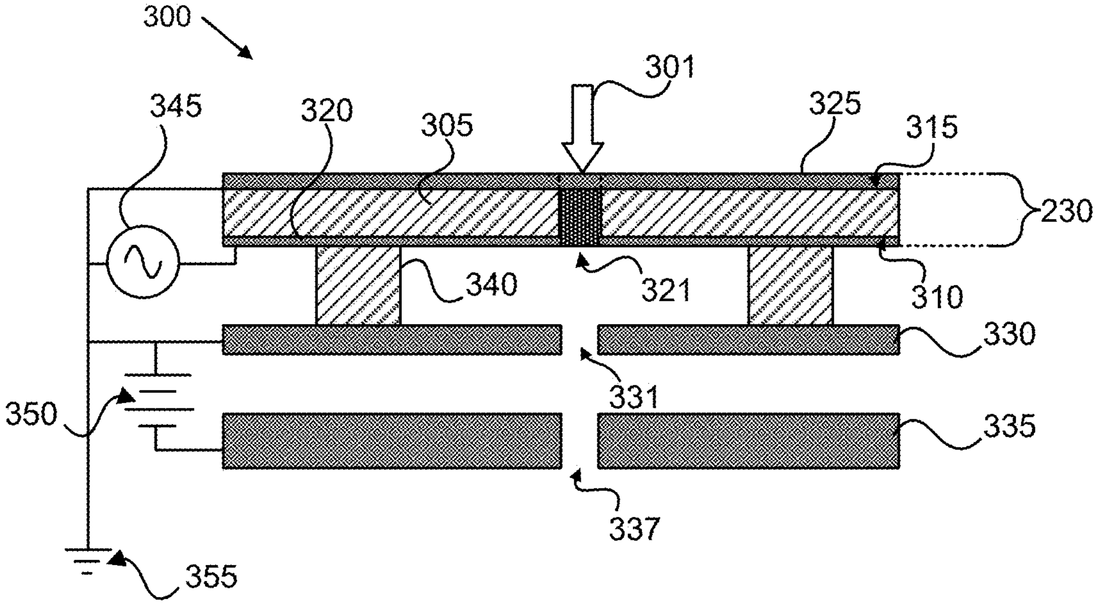
FIG. 3A is a schematic diagram illustrating an example ion source, in accordance with some embodiments of the present disclosure.

FIG. 3A is a schematic diagram illustrating components of an example ion source 300, in accordance with some embodiments of the present disclosure. The components illustrated are arranged as part of the example ion source 300 configured in the "suspended" design, whereby a flow 301 of plasma precursor gas is introduced transverse to the resonator (e.g., resonator 230 of FIGS. 2A-2B), for example, via an aperture or other fluid deliver coupling of the resonator (e.g., coupler 210 of FIG. 2A) formed in a substrate 305 of the resonator 230. The example ion source 300 includes a resonator 230, a source electrode 330, an extractor electrode 335, a spacer 340, an RF power supply 345, a DC power supply 350, and a relative ground 355. The resonator 230 includes the substrate 305, a first conductive layer 320, and a second conductive layer 325. The resonator 230 defines an aperture 321 (e.g., aperture 260 of FIG. 2B), substantially aligned with corresponding apertures 331 and 337 in the source electrode 330 and the extractor electrode 335, respectively.

The discussion of the components of example ion source 300 focuses on electrical sub-systems. To that end, FIG. 3A omits one or more components of the example ion source 300 that are discussed in more detail in reference to FIG. 2A. The substrate 305 can be or include a dielectric material, such as a ceramic material (e.g., quartz, silicon oxide, titanium oxide, etc.) or other insulating dielectric material. The substrate 305 can define a first side 310 and a second side 315, opposite the first side 310. The first conductive layer 320, which can be configured to carry an alternating current (AC) signal (e.g., an RF signal from about 0.5 GHz to about 6.0 GHz, including sub-ranges, fractions, and interpolations thereof), can be disposed on the first side 310 and oriented toward the source electrode 330. In some embodiments, the AC signal can include an RF signal from about 0.4 to about 2.4 GHz in frequency, including sub-ranges, fractions, and interpolations thereof. The second conductive layer 325 can be disposed on the second side 315. The second conductive layer 325 can be configured to be electrically coupled to the relative ground 355. Similarly, the source electrode 330 can be coupled to a relative ground 355, but can also be biased relative to the second conductive layer 325. The extractor electrode 335 can be biased relative to the source electrode 330, for example, by application of a DC bias voltage applied by the DC power supply 350.

In some embodiments, the relative ground 355 can be a reference voltage, rather than a true ground potential. For example, the relative ground 355 can correspond to a voltage referred to as a "common" voltage that is applied to components of the column, as part of improving the performance of the charged particle beam source (e.g., reducing aberrations and improving spot size, etc.). To that end, the relative ground 355 can be a positive or negative voltage having a magnitude from about 0 V to about 100 kV, including fractions, sub-ranges, and interpolations thereof. In an illustrative example, the relative ground can 355 can have a magnitude from about 0.5 kV to about 30 kV, including sub-ranges, fractions, and interpolations thereof.

Figure 3B:
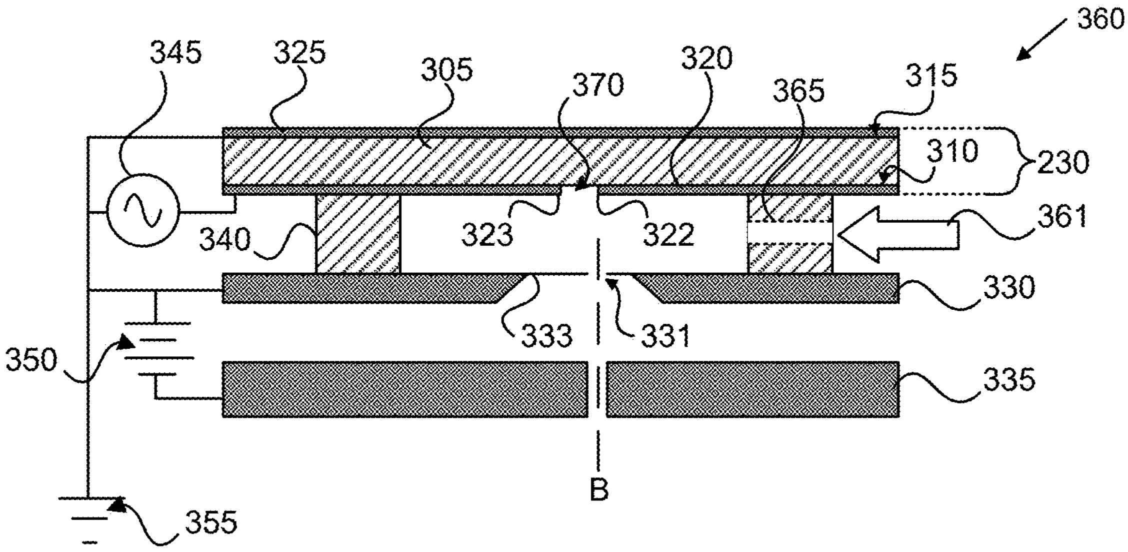
FIG. 3B is a schematic diagram illustrating an example ion source, in accordance with some embodiments of the present disclosure.

FIG. 3B is a schematic diagram illustrating components of an example ion source 360, in accordance with some embodiments of the present disclosure. As in FIG. 3A, the discussion of the components of example ion source 360 focuses on electrical sub-systems. To that end, FIG. 3B omits one or more components of the example ion source 360 that are discussed in more detail in reference to FIG. 2A. The components illustrated are for an ion source configured in the "inverted" design, whereby a flow 361 of plasma precursor gas is introduced substantially parallel to the resonator (e.g., resonator 230 of FIGS. 2A-2B), for example, via a conduit 365 or other fluid delivery coupling of the resonator (e.g., coupler 210 of FIG. 2A) formed in a spacer 340. The example ion source 360 includes a resonator 230, a source electrode 330, an extractor electrode 335, the spacer 340, an RF power supply 345, a DC power supply 350, and a relative ground 355. The resonator 230 includes a substrate 305, a first conductive layer 320, and a second conductive layer 325. The resonator 230 defines an aperture 321 (e.g., aperture 260 of FIG. 2B), substantially aligned with corresponding apertures 331 and 337 in the source electrode 330 and the extractor electrode 335, respectively.

The "inverted" design illustrated in FIG. 3B is characterized by a discharge region formed between the source electrode 330 and the resonator 230, whereby the first conducting layer 320 is disposed on the substrate 305 according to a pattern, as described in more detail in reference to FIGS. 4A-10D. The pattern includes a ring portion (illustrated and described in reference to the forthcoming figures), which defines a gap 370 between a first end 322 of the ring portion and a second end 322 of the ring portion. In contrast to the "suspended" design of FIG. 3A, the example ion source 360 omits an aperture formed through the substrate 305 and the second conductive layer 325. In some embodiments, the source electrode 330 is configured such that an extraction aperture 331 is oriented over the first end 322 or the second end 323, such that an axis B of the example ion source 360 is offset relative to the geometric center of the gap 370. Advantageously, orienting the axis B to be substantially aligned with the first end 322 or the second end 323 can improve the performance of the example ion source 360 with respect to one or more properties of the source. For example, such an arrangement can increase the brightness of the source, power efficiency of the source, operating pressure of the source, among other benefits, relative to a configuration in which the extraction aperture 331 is substantially centered over the gap 370. Without being bound to a particular physical phenomenon or mechanism of action, the technical advantages described can derive at least in part from spatial variation of the ion density that results in a relatively higher ion density nearer to the first end 322 and/or the second end 323, as compared to the geometric center of the gap 370.

The extraction aperture 331 can be formed in a foil 333 portion of the source electrode 330, as described in more detail in reference to FIGS. 2A-2B. The aperture 331 can be formed in the foil 333 using various techniques including ion beam patterning. For example, the foil 333 can include multiple apertures 331 and can be formed after the example ion source 360 is at least partially assembled. Advantageously, the extraction aperture 331 and portions of the resonator 230 can be aligned with improved precision, in cases where one or more components of the example ion source are subject to relatively high fabrication variability.

Figure 4A:
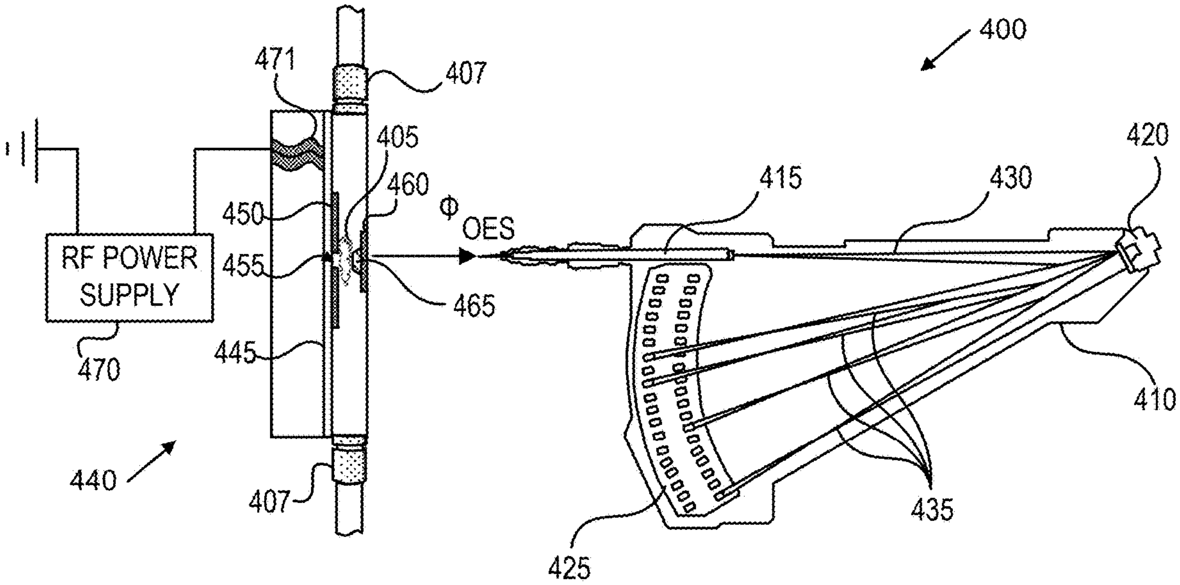
FIG. 4A is a schematic diagram illustrating an example optical emission spectroscopy system including an ion source of FIGS. 2A-3B, in accordance with some embodiments of the present disclosure.

FIG. 4A is a schematic diagram illustrating the operation of an example optical emission spectroscopy system 400 including an embodiment of the ion sources of FIGS. 2A-3B, in accordance with some embodiments of the present disclosure. The example optical emission spectroscopy (OES) system 400 is configured to introduce an analyte to a discharge region between the resonator and the source electrode, and to generate a plasma discharge 405 including the analyte, from which a flux of characteristic photons ($\phi_{OES}$) is directed from the discharge 405 to a spectrometer 410. The spectrometer 410 includes an input optic 415 (e.g., a collimator, one or more lenses, etc.), a diffraction optic 420 (e.g., a grating, mirror, distributed Bragg reflector (DBR), etc.), and a detector 425 (e.g., a bank of sensors, a traversing sensor, etc.), that together decompose a composite photon beam 430 into one or more constituent beams 435 from which OES spectrum data can be generated.

In the OES configuration shown in FIG. 4A, the analyte can be provided to the discharge region by one or more techniques, including as an atomized vapor (e.g., for a liquid analyte), as a gaseous vapor, and/or as a solid (e.g., as a crystalline solid or other powder form). To that end, the ion source 440 is provided with fluid couplers 407 to introduce and/or remove the analyte from the discharge region. Advantageously, for OES operation, the example system 400 can be configured to operate at or near atmospheric pressure, under vacuum, or at a pressure above atmospheric. In some cases, the operating pressure can be based at least in part on the nature of the analyte being processed and corresponding discharge properties. For example, an analyte that has a relatively high ionization threshold energy and emits characteristic photons at relatively high plasma pressures can benefit from operating the example system 400 near or above atmospheric pressure and at relatively high plasma power. In contrast, where the analyte is prone to decomposition at high ionization fraction (e.g., in thermal plasmas), the example system can benefit from operating under vacuum or in the presence of a relatively high proportion of neutral gas, with relatively low plasma power.

In the example system 400, the ion source 440 is an example of the "inverted" designs of FIG. 2A and FIG. 3B, in that a resonator 445 omits an aperture formed through a first conducting layer 450. A gap 455 defined in the first conducting layer 450 is substantially oriented with respect to the source electrode 460 such that the photon flux emanating from the discharge 405 is transmitted from the ion source 440 to the input optic 415 of the spectrometer 410. To that end, the source electrode 460 can be or include a material that is substantially transparent to photons in a given spectral range (e.g., ultraviolet, visible, infrared, etc.) and electrically conducting. Examples of such materials include indium tin oxide (ITO), among others. The ion source 440 includes a transparent portion 465 for such a purpose.

Embodiments of the example system 400 omit the source electrode, relying on the RF energy provided by the RF power supply 470, via the electrical coupler 471, to generate and sustain the discharge 405, as described in more detail in reference to FIGS. 5A-11. The source electrode 460 can improve the performance of the ion source 440 by allowing for control of the discharge volume, for example, by expanding the discharge volume into the space between the the source electrode 460 and the first conducting layer 450. Conversely, the source electrode 460 can also compress the discharge volume, thereby increasing the plasma density and emphasizing photon emission for some analytes.

Figure 4B:
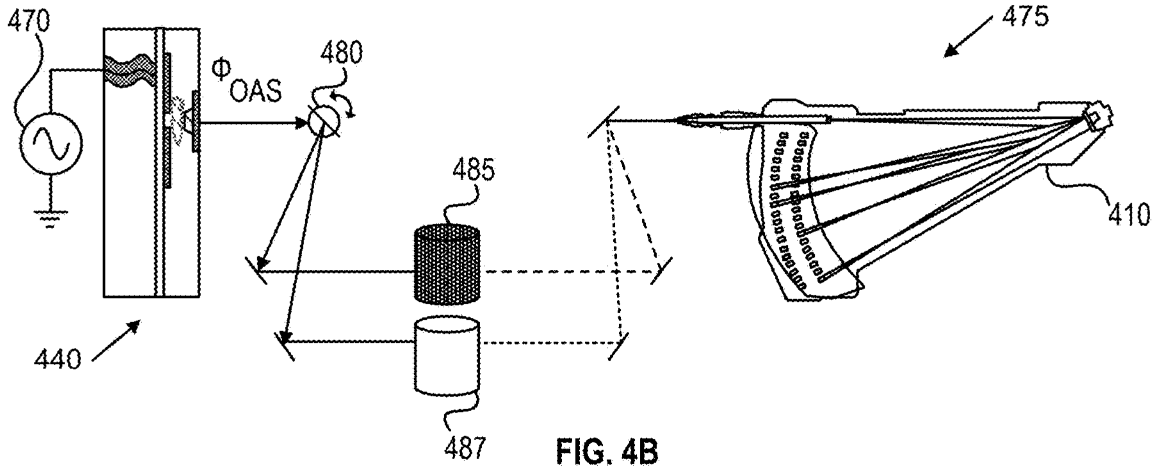
FIG. 4B is a schematic diagram illustrating an example optical absorption spectroscopy system including an ion source of FIGS. 2A-3B, in accordance with some embodiments of the present disclosure.

FIG. 4B is a schematic diagram illustrating the operation an example optical absorption spectroscopy (OAS) system 475 including an embodiment of the ion sources of FIGS. 2A-3B, in accordance with some embodiments of the present disclosure. The ion source 440 of example system 475 includes the same or similar internal components and power systems as described in reference to FIG. 4A. The fluid couplers 407 are omitted from this description to focus on the optical aspects. In some embodiments, however, the fluid couplers 407 can be included, or can be omitted entirely, for example, where the ion source 440 is configured as a sealed light source (e.g., a calibrated light source) for OAS applications. In this way, the example system 475 includes optical elements absent from the example system 400 of FIG. 4A, such as a beam splitter optic 480, which can be or include a mirror disposed on turret, a partially transmissive mirror, or the like, that configures the example system 475 to pass a test beam of photons through an analyte cell 485 and a reference beam of photons through a reference cell 487, for example, as part of an OAS procedure. The example system 475 is illustrated with separate cells 485 and 487 for use in a calibrated OAS system that can be used with unknown samples. Embodiments of the present disclosure can omit one or more elements shown, for example, where the system is configured for a known analyte (e.g., as part of a quality control procedure), such that the reference beam path can be omitted. In some embodiments, example system 475 can be configured as an ultraviolet-visible OAS system, in which case the ion source 440 can be configured to generate a discharge 405 that favors emission of photons in the UV-visible spectral ranges (e.g., using mercury vapor for UV photons).

Figure 4C:
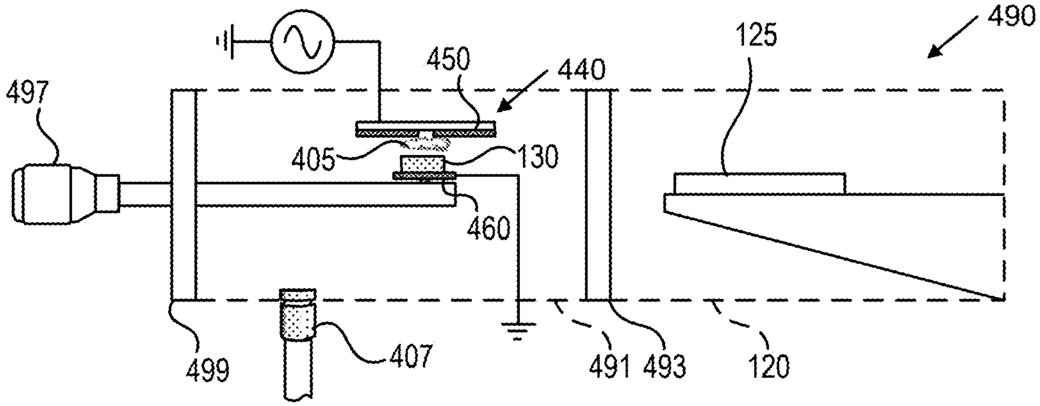
FIG. 4C is a schematic diagram illustrating an example volumetric plasma system including an ion source of FIGS. 2A-3B, in accordance with some embodiments of the present disclosure.
Figure 4D:
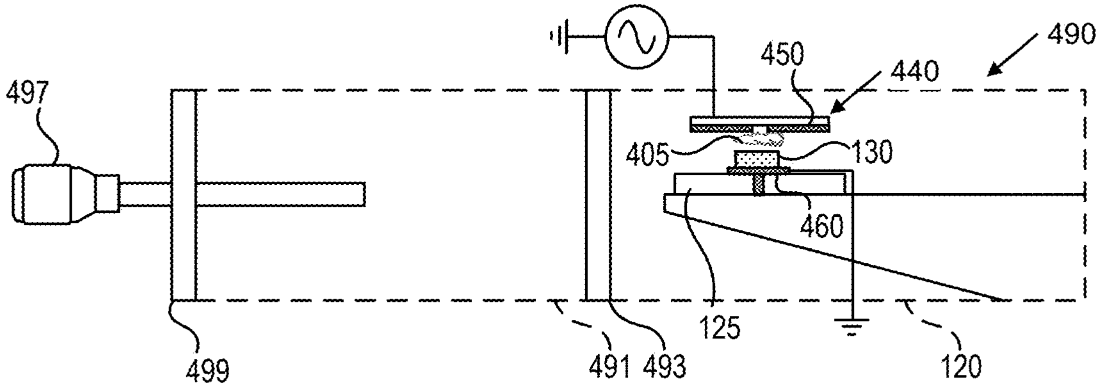
FIG. 4D is a schematic diagram illustrating an example volumetric plasma system including an ion source of FIGS. 2A-3B, in accordance with some embodiments of the present disclosure.

FIGS. 4C-4D are schematic diagrams illustrating the operation of an example volumetric plasma system 490 including an embodiment of the ion sources of FIGS. 2A-3B, in accordance with some embodiments of the present disclosure. The example system 490 is configured to expose a sample 130, as described in more detail in reference to FIG. 1, to the discharge 405 as part of one or more procedures to prepare the sample for introduction to the vacuum chamber 120 of the example system 100 (e.g., coupling with the sample stage 125). Examples of such procedures include, but are not limited to, volumetric plasma cleaning, ion etching, electron etching, plasma-based coating, ion sputtering, or the like. The example system 490 includes a load lock chamber 491, isolated from the vacuum chamber 120 by a valve 493 (e.g., a gate valve or the like), in which the ion source 440 is disposed, with the sample 130 being disposed on an electrically conductive substrate 460 that serves as at least part of the source electrode (e.g., a stub or other sample holder) when electrically coupled with a relative ground or with a DC voltage source. The sample 130 can be disposed in the ion source 440 using one or more sample manipulation tools 497, via a vacuum feedthrough 499 that permits the sample 130 to be exposed to the discharge 405 and subsequently transferred to the sample stage 125. Alternatively, the sample stage 125 can be configured to have a movement range extending across the load lock chamber 491 and/or across the vacuum chamber 120. In this way, the sample 130 can be coupled with the sample stage 125 (e.g., via the substrate 460), such that the sample stage 125 can be moved to a cleaning position that is different from an imaging position of the charged particle microscope, as illustrated in FIG. 4D. In this context, the cleaning position can be in the vacuum chamber 120 or in the load lock chamber 491, such that the cleaning process (e.g., exposure to a plasma generated as described in reference to FIG. 4C) can be undertaken at some remove from the beam axis and sensitive optics of the charged particle beam column (e.g., axis A, axis B, of FIG. 1). In some embodiments, the motion of the sample 130 is achieved automatically or pseudo-automatically, but can also be achieved manually.

Figure 5A:
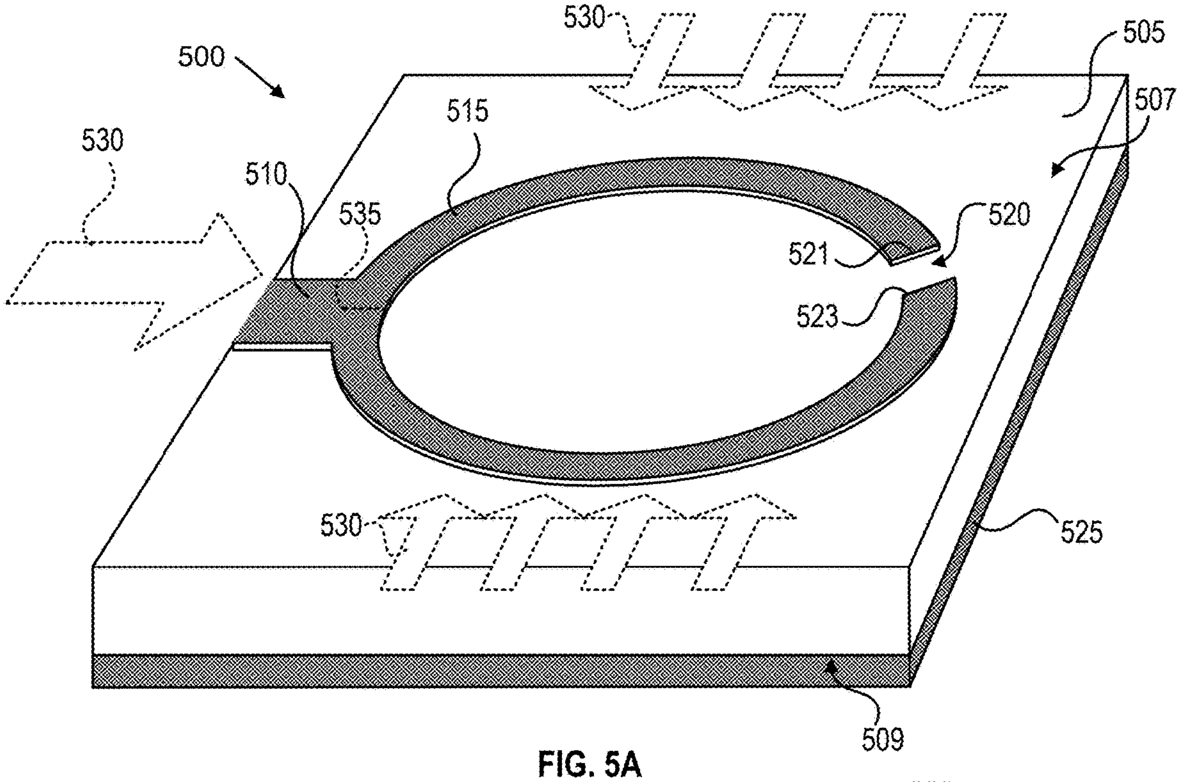
FIGS. 5A-5C are schematic diagrams illustrating an example ion source of FIGS. 2A-3B including a single split ring resonator, in accordance with some embodiments of the present disclosure.
Figure 5B:
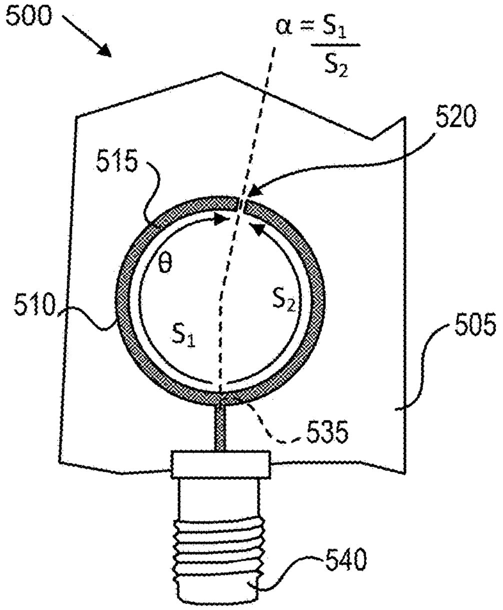
Figure 5C:
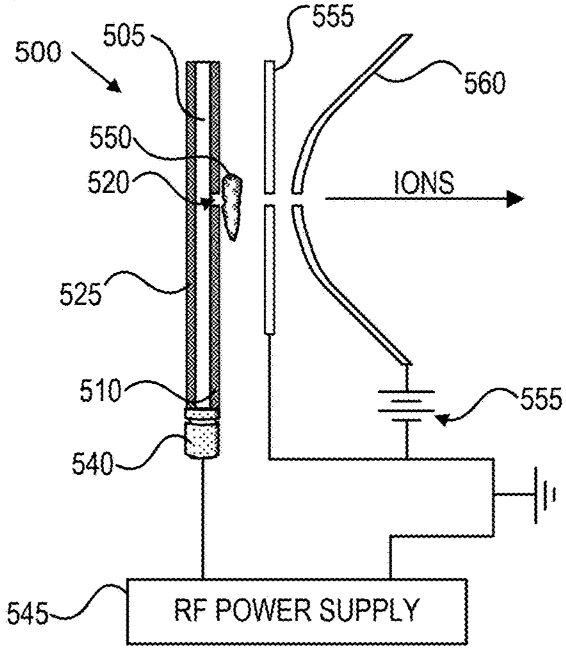

FIGS. 5A-5C are schematic diagrams illustrating components of an example resonator 500 representing an embodiment of the ion sources of FIGS. 2A-4C including a single split ring resonator, in accordance with some embodiments of the present disclosure. The discussion of the components of example resonator 500 focuses on the patterning of elements of the resonator 500, as well as electrical subsystems with which it is electrically coupled. To that end, FIGS. 5A-5C omit one or more components of the example ion sources that are discussed in more detail in reference to FIGS. 2A-4C. The example resonator 500 includes a substrate 505. The substrate 505 defines a first side 507 and a second side 509. The example resonator 500 includes a first conductive layer 510 disposed on the first side 507. The first conductive layer 510 is disposed in accordance with a pattern comprising a ring portion 515. The pattern further defines a gap 520 in the ring portion 515 of the first conductive layer 510. The second side 509 is opposite the first side 507, with respect to two substantially planar faces of the substrate 505. The example resonator 500 includes a second conductive layer 525 disposed on the second side 509.

The example resonator 500 is illustrated as an embodiment of the "inverted" design of FIG. 2A and FIG. 3B. To that end, the example resonator 500 omits an aperture formed through the substrate 505. In some embodiments, however, the substrate 505 defines an aperture extending from the first side 507 to the second side 509. The aperture can be defined in the substrate 505 at a position substantially co-located with the gap 520 (e.g., as part of the "suspended" design), but can also be defined elsewhere, such as within the periphery of the ring portion 515, outside the ring portion 515, or the like. In this way, the aperture can serve as a fluid delivery coupler (e.g., fluid delivery coupler 210 of FIG. 2A), by which one or more precursors 530 can be delivered to the vicinity of the gap 520. In the "inverted" design of FIG. 2A or FIG. 3B, the precursor flow can be substantially parallel to the first side 507. In some embodiments, a fluid delivery coupler can be included at a position away from the gap 520, such that the precursor 530 can be delivered via the substrate 505 and/or the second conductive layer 525, while still maintaining a substantially parallel flow profile with respect to the first side 507 in a vicinity of the gap 520.

The ring portion 515 in FIG. 5A is shown as substantially circular, but can assume alternative shapes and/or form factors, based at least in part on constraints such as geometric restrictions imposed by an enclosure as well as the interrelated nature of the shape of the ring portion with the operating frequency of the alternating current power signal used to ignite and sustain the discharge. In this way, the radius of the ring portion 515 can depend at least in part on angular position, $\theta$, relative to the input point 535. Without being bound to a particular physical mechanism or principle of operation, the pattern by which the first conductive layer 510 is disposed on the first side 507 can be based at least in part on the operating frequency of the example resonator 500.

For example, the pattern can define an input point 535 in the ring portion 515 at a first fractional position, $\alpha$, on the ring portion 515. As illustrated in FIG. 5B, the fractional position, α, is a ratio of a first path length S1 between the gap 520 and the input point 535 in a first direction, relative to a second path length S2 between the gap 520 and the input point 535 in a second direction different from the first direction. The fractional position, α, can be related to an angle (e.g., out of 360 degrees or 2π radians) for a ring portion 515 that is substantially circular, (but an angular description can be less meaningful for non-circular patterns of the ring portion 515, e.g., racetrack shaped ring portions 515 or other configurations for which the radius of the shape is a function of angle, θ), for which the rays extending from the input point 535 and the gap 520 can fail to intersect at a geometric center of the ring portion 515.

In a general expression, the fractional position, α, can correspond to the mathematical expression $$\alpha = \frac{\theta}{2\pi - \theta},$$

which returns a value for α of 0 for a value of S1=0, a value of 1 for a value of S1=πr, and a value of o for a value of S1=2πr, for which θ=0, π, and 2π, respectively, where r is the radius of the ring portion in circular designs. For non-circular ring portions 515, the values of S1, S2, S3, etc. can be defined without reference to a radius.

While the value of ∞ is not physically meaningful, the mathematical expression above reveals that fractional positions with a value greater than 1 correspond to positions on the ring portion 515 for which a negative value of θ corresponds to a functional configuration of the input point 535 relative to the gap 520. In this way, a given fractional position can correspond to two well-matched configurations. In some embodiments, values of fractional position, α, between about −1 and about 1 are effective to provide a well matched resonator 500 for a given set of operating parameters and plasma conditions. For example, in the absence of a discharge (e.g., pre-ignition conditions) a fractional positions greater than about 0.4 (e.g., nearer to 1 or about equal to 1) yield two functional configurations, corresponding to a positive value of θ and the corresponding negative value of 0. For at least this reason, the value of fractional position, α, can be expressed as a positive value, derived using the magnitude (e.g., absolute value) of θ and or the unsigned values of S1 and S2. In other terms, the "direction" of signed-θ can be understood to be defined with respect to the input point 535 or the gap 520. In some embodiments, a fractional position of 1, corresponding to θ=π, for example, can result in relatively poor power transfer into the gap 520 when typical 50Ω impedance hardware is employed in the power circuitry driving the resonator 500, associated with the input impedance of the resonator 500 approaching a value of zero.

In the context of example resonator 500, the operating frequency refers to a characteristic frequency of an AC power signal that can be provided to the ring portion 515 by a power circuit, illustrated in FIB 5C, which can include an RF power supply 545 that is coupled with the ring portion 515 via an electrical coupler 540, in electrical contact with the input point 535. In this context, the RF power supply 545 is operatively coupled with the resonator 500 configured to generate different power signals based at least in part on whether the discharge 550 is present or absent. For example, a first power signal can be provided to the first conductive layer 510 that is well-matched in an absence of a discharge, and configured to ignite the discharge 550, followed by one or more changes to the power electronics, as an approach to reducing and/or substantially eliminating reflected power as the conditions in the discharge volume change. The example resonator 500, being provided with a single input point 353, relies on modifying an impedance matching network to accommodate the change in reflected power without damaging the microwave amplifier.

Advantageously, embodiments of the present disclosure described in reference to the forthcoming figures are configured to provide well matched impedance conditions without relying on dynamic matching networks. In this context, the term "well-matched" is used to refer to a condition of negligible or substantially no reflected power being measured at the RF power supply during operation with a given power signal. The example resonator 500 can be driven by the RF power supply 545 as part of an ion beam source, as described in more detail in reference to FIGS. 2A-3B, with a source electrode 555 and an extractor electrode 560 being provided to extract a beam of ions toward a FIB column (e.g., FIB column 111 of FIG. 1).

Figure 6A:
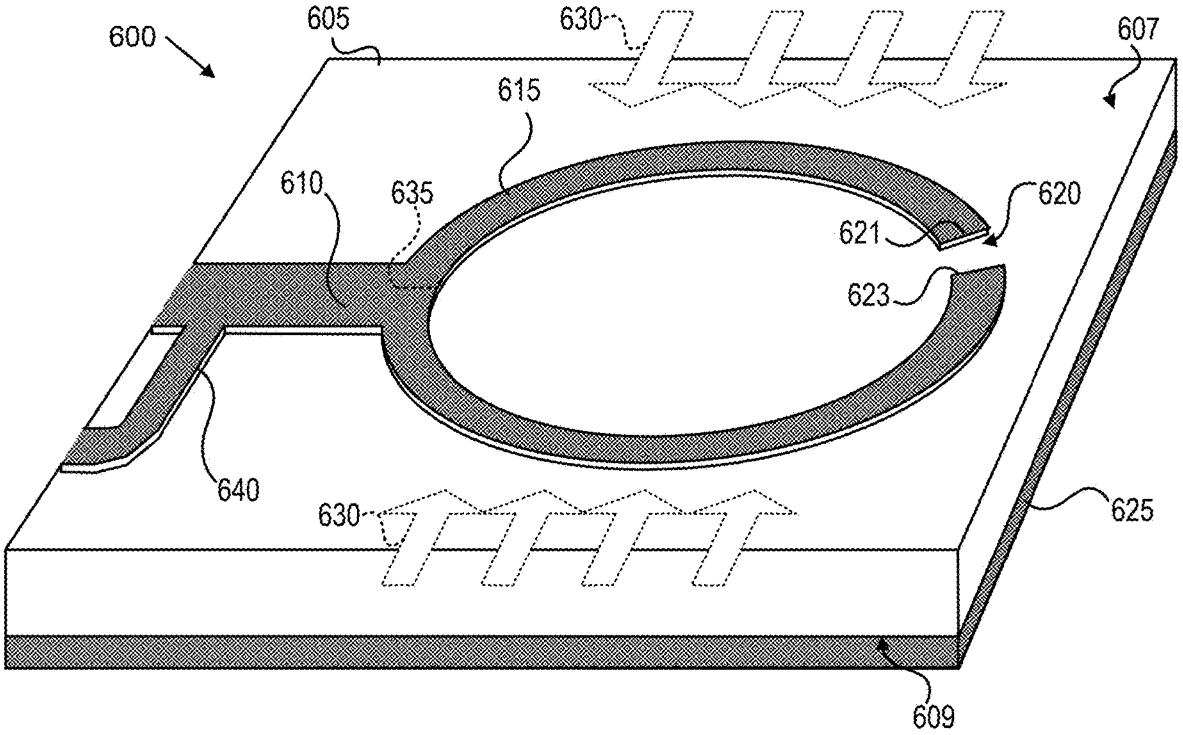
FIGS. 6A-6C are schematic diagrams illustrating an example ion source of FIGS. 5A-5C including a bias tee, in accordance with some embodiments of the present disclosure.
Figure 6B:
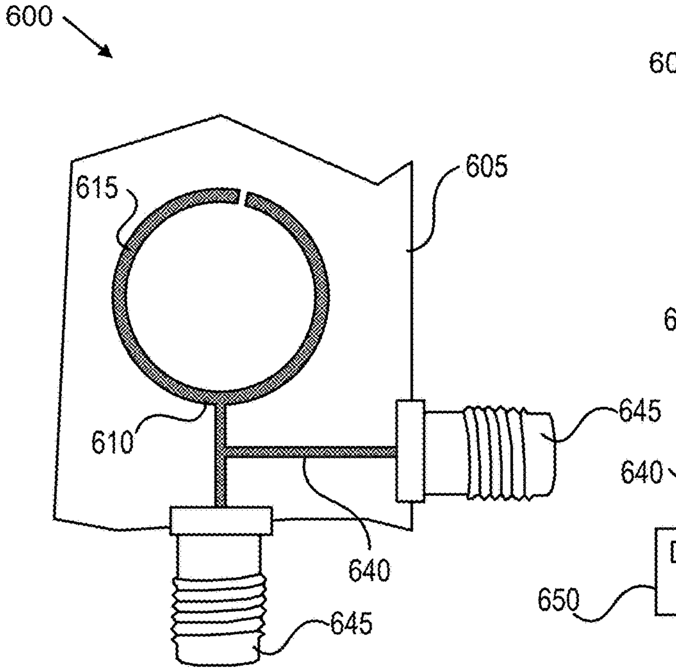
Figure 6C:
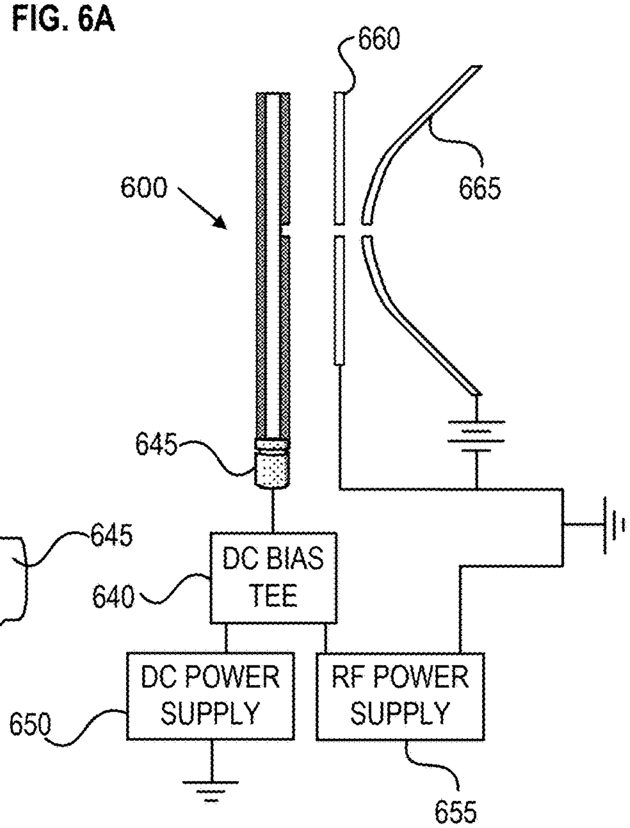

FIGS. 6A-6C are schematic diagrams illustrating components of an example resonator 600 including a bias tee 640, representing an embodiment of the ion sources of FIGS. 2A-5C including a single split ring resonator, in accordance with some embodiments of the present disclosure. The discussion of the components of example resonator 600 focuses on the patterning of elements of the resonator 600, as well as electrical sub-systems with which it is electrically coupled. To that end, FIGS. 6A-6C omit one or more components of the example ion sources that are discussed in more detail in reference to FIGS. 2A-5C. The example resonator 600 includes a substrate 605. The substrate 605 defines a first side 607 and a second side 609. The example resonator 600 includes a first conductive layer 610 disposed on the first side 607. The first conductive layer 610 is disposed in accordance with a pattern comprising a ring portion 615. The pattern further defines a gap 620 in the ring portion 615 of the first conductive layer 610 that is exposed to a precursor provided by one or more flows 630 of precursor fluid (e.g., gas, vapor, etc). The second side 609 is opposite the first side 607, with respect to two substantially planar faces of the substrate 605. The example resonator 600 includes a second conductive layer 625 disposed on the second side 609.

The bias tee 640 can constitute a portion of the first conductive layer 610, as illustrated in FIG. 6A-6B, or it can be a separate conductive element that is electrically coupled with the first conductive layer 610 at an input point 635 via an electrical coupler 645, as illustrated in FIG. 6C. The bias tec 640 can permit an ion source including the example resonator 600 (e.g., the electrical components of which are illustrated in FIG. 6C) to modulate an offset voltage of an RF power signal provided to the first conductive layer 610. In this context, the offset voltage refers to a voltage that modifies an average voltage of the RF power signal, which can be measured in various ways (e.g., mean voltage, etc.). Advantageously, applying a bias voltage, such as a DC bias voltage generated by a DC power supply 650, to the RF power signal generated by an RF power supply 655, has been shown to improve the performance of resonators of the present disclosure as ion sources, based at least in part on a measurement of increased ion flux through a source electrode 660 and/or an extractor electrode 665, for a given RF power and other parameters being substantially consistent.

Figure 7A:
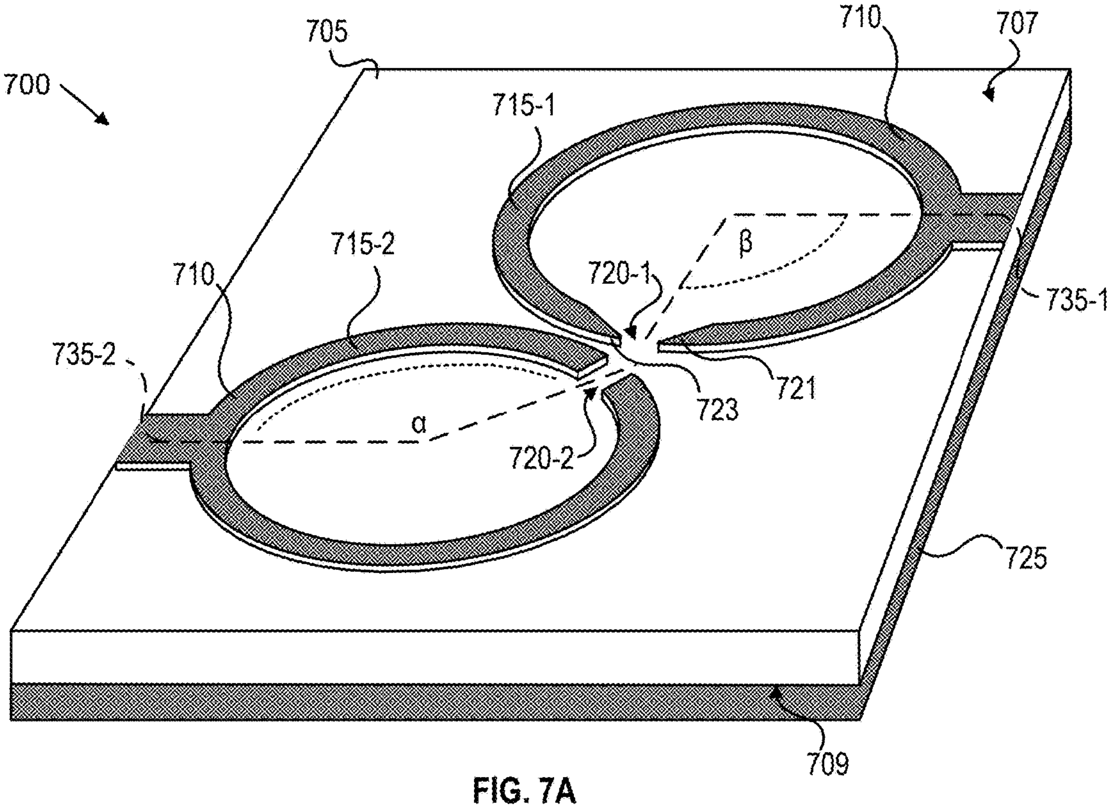
FIGS. 7A-7C are schematic diagrams illustrating an example ion source of FIGS. 2A-3B including a dual split ring resonator, in accordance with some embodiments of the present disclosure.
Figure 7B:
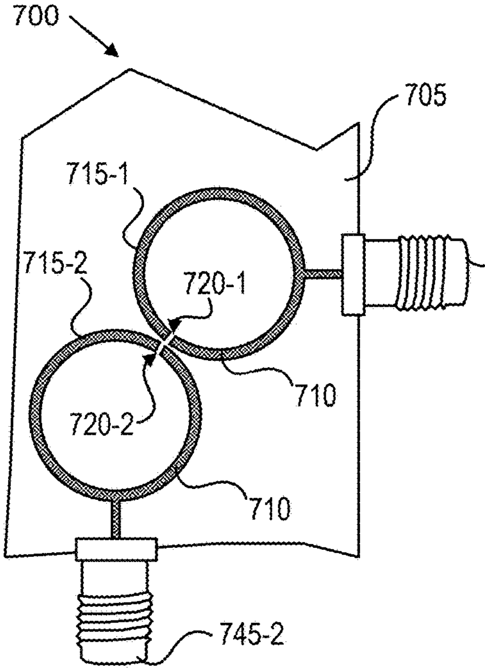
Figure 7C:
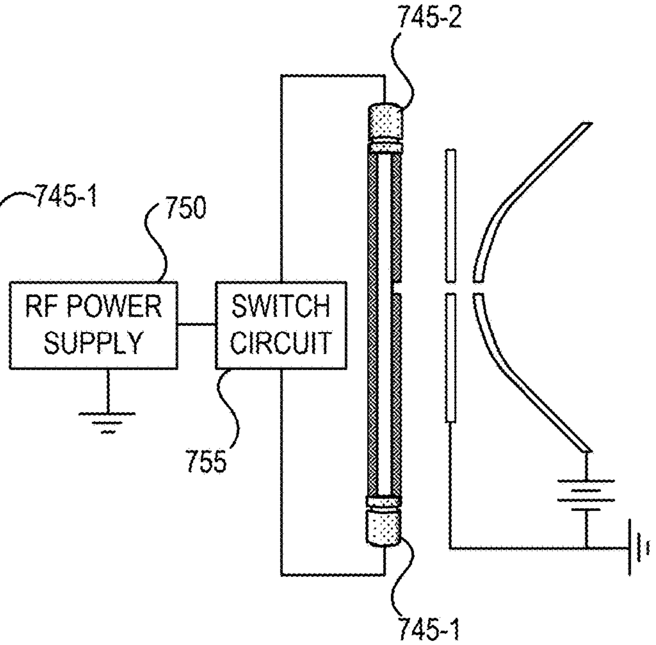

FIGS. 7A-7C are schematic diagrams illustrating an example resonator 700 including multiple ring portions 715, representing an embodiment of the ion sources of FIGS. 2A-5C, in accordance with some embodiments of the present disclosure. The discussion of the components of example resonator 700 focuses on the patterning of elements of the example resonator 700, as well as electrical sub-systems with which it is electrically coupled. To that end, FIGS. 7A-7C omit one or more components of the example ion sources that are discussed in more detail in reference to FIGS. 2A-5C. The example resonator 700 includes a substrate 705. The substrate 705 defines a first side 707 and a second side 709. The example resonator 700 includes a first conductive layer 710 disposed on the first side 707. The first conductive layer 710 is disposed in accordance with a pattern comprising a first ring portion 715-1 and a second ring portion 715-2. The pattern further defines a first gap 720-1 in the first ring portion 715-1 of the first conductive layer 710 and a second gap 720-2 in the second ring portion 715-2. The second side 709 is opposite the first side 707, with respect to two substantially planar faces of the substrate 705. The example resonator 700 includes a second conductive layer 725 disposed on the second side 709. In reference to the resonators of FIGS. 5A-5C, the first ring portion 715-1 defines the first gap 720-1 at a first fractional position, α. The second ring portion 715-2 defines the second gap 720-2 at a second fractional position, β. The respective fractional positions α and β can be equal or can differ in value. In some embodiments, one or more dimensional characteristics of the first ring portion 715-1 and the second ring portion 715-2 can differ, such as a thickness of the first conductive layer 710 in the respective ring portions 715. For example, a thickness of the first conductive layer 710 in the first ring portion 715-1 can be larger or smaller than that of the second ring portion 715-2, as an approach to compensating for the influence of fractional position on characteristic impedance of the respective ring portions 715. In some embodiments, one or more of the ring portions 715 can include a tapered portion near the respective gap 720, as shown in FIG. 7A for the first gap 720-1, tapering at a first end 721 and a second end 723. Without being bound to a particular physical mechanism or principle of operation, tapering a ring portion 715 can localize discharge formation nearer the corresponding gap of the counterpart ring portion 715, as an approach to improving the transfer of the discharge from one ring portion 715 to the other, thereby maintaining the well-matched impedance condition.

In operation as part of an ion source of the present disclosure (e.g., ion source 110 of FIG. 1), the example resonator can switch between two or more operating modes. A first mode can be characterized by a set of operating parameters (e.g., operating pressure, gas composition, RF power signal, etc.) that are configured to promote ignition of a discharge in the first gap 720-1. A second mode can be characterized by a set of operating parameters that are configured to sustain a discharge in the second gap 720-2. To that end, the example resonator 700 can be configured to ignite a discharge in the first gap 720-1 by operating in the second mode and to maintain and/or sustain the discharge in the second gap 720-2 by operating in the first mode, based at least in part on switching between the first mode and second mode (e.g., in response to the ignition of the discharge), as described in more detail in reference to FIG. 11.

The respective fractional positions α and β can be defined such that a single RF power supply 655 (illustrated in FIG. 7C) can provide a well matched impedance condition in the presence and/or the absence of a discharge in the first gap 720-1 and/or the second gap 720-2. In some embodiments, the fractional positions α and β can be defined to place the gaps 720 in proximity to each other, with the respective input points 735 defined to account for geometric constraints of the resonator 700 (e.g., package constraints, shielding requirements, etc.). As described in reference to FIGS. 5A-5C, the fractional positions α and β can have values in a range from about 0 to about 1, including fractions, interpolations, and subranges thereof, with a value from about 0.4 to about 1 being used for the first mode of operation and a value from about 0 to about 1 for the second mode of operation, including fractions, interpolations, and subranges thereof, or the corresponding "negative" configurations, described in reference to FIGS. 5A-5B. In some embodiments, fractional position value for the second mode is smaller than the fractional position value for the first mode.

In some embodiments, the example resonator is electrically coupled with one or more RF power supplies 750 via respective electrical couplers 745, as illustrated in FIGS. 7B-7C. Separate RF power supplies can be used to reduce the need for dynamic matching circuits, each respective power supply being configured to generate a specific power signal used for one of the operating modes. This approach to providing a well-matched impedance condition for each mode can increase the expense of the ion source, relative to a system that includes a switching circuit 755, configured to direct the RF power signal to the first input point 735-1 or the second input point 735-2 by reversibly coupling the power supply 750 with the first ring portion 715-1 or the second ring portion 71-2, based at least in part on on one or more characteristics of the operating condition of the example resonator 700, such as the presence or absence of the discharge.

In an illustrative example, the switching circuit 755 can include electrical components that together respond to a change in current and/or reflected power from the first ring portion 715-1 (e.g., indicative of an ignition of the discharge) to switch to the second input point 735-2. In such cases, the overall configuration of the example resonator 700 (e.g., the design of the pattern by which the first conductive layer 710 is formed) can permit the RF power supply 750 to provide a substantially consistent RF power signal to the second ring portion 710-2 via the second input point 735-2, such that a discharge can be ignited in the first gap 720-1 and can migrate to the second gap 720-2. In the presence of the discharge, the switching circuit 755 can couple the RF power supply 750 with the second ring portion 715-2 via the second input point 735-2. This approach, using a switching circuit 755 and multiple ring portions 715, can reduce the need for dynamic power electronics (e.g., complex RF power supply, matching circuit, large heat sink, etc.), with confers advantages to embodiments of the present disclosure, at least in terms of robustness, reduced complexity, reduced economic cost, and reduced physical size, relative to other ion beam source systems. Such advantages are further supplemented by the significant improvements in power consumption, gas flowrate, expense, and manufacturing complexity, among other improvements, relative to typical FIB source technologies (e.g., ICP, etc.).

Figure 8A:
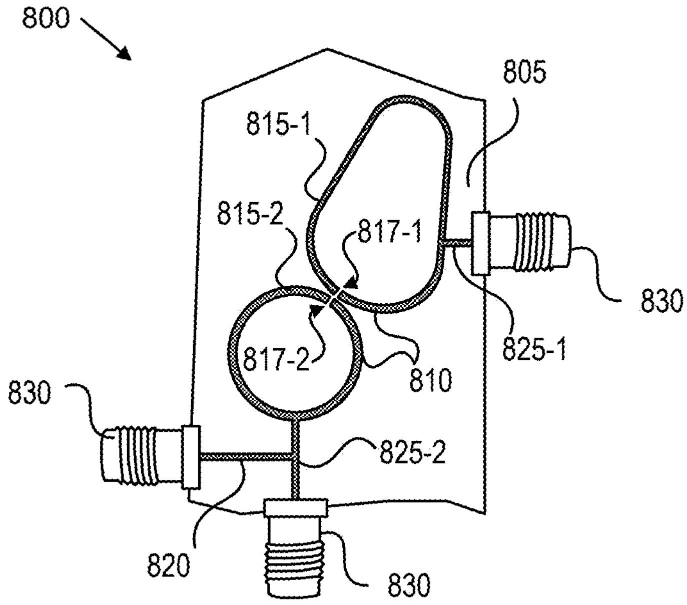
FIGS. 8A-8B are schematic diagrams illustrating the example ion source of FIGS. 7A-7C including a bias tee, in accordance with some embodiments of the present disclosure.
Figure 8B:
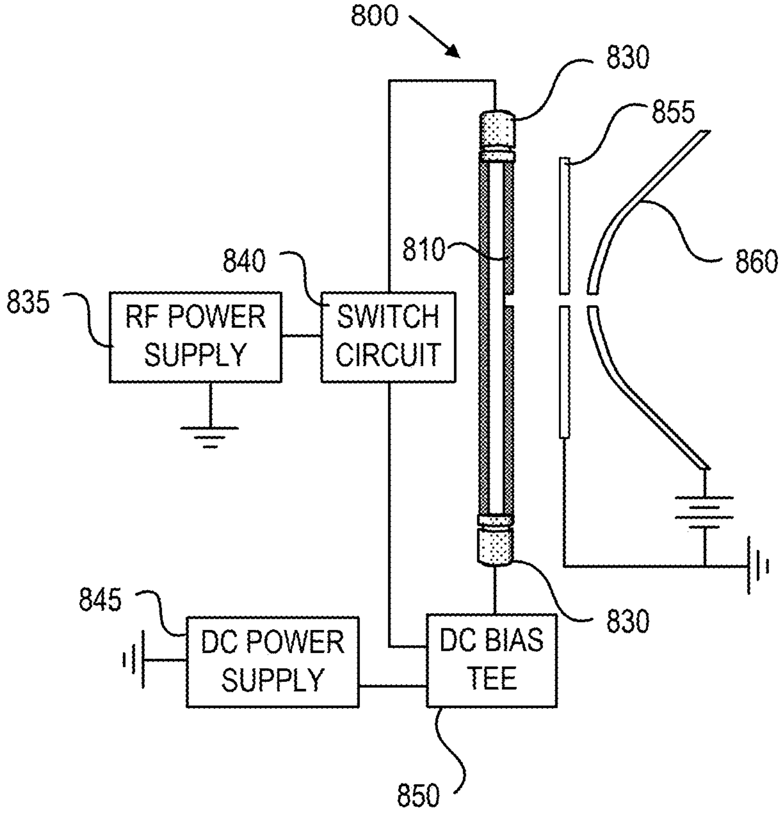

FIGS. 8A-8B are schematic diagrams illustrating an example resonator 800 including multiple ring portions 815, representing an embodiment of the ion source of FIGS. 7A-7C including a bias tee 820, in accordance with some embodiments of the present disclosure. The bias tec 820, as described in more detail in reference to FIGS. 6A-6C, can improve the performance of the example resonator 800 as an ion source for FIB applications. The improvement can be based at least in part on modulating and/or controlling a voltage offset of the RF power signal used to ignite and/or sustain a discharge from which ions are extracted, as described in more detail in reference to FIGS. 2A-7C. The discussion of the components of example resonator 800 focuses on the patterning of elements of the example resonator 800, as well as electrical sub-systems with which it is electrically coupled. To that end, FIGS. 8A-8B omit one or more components of the example ion sources that are discussed in more detail in reference to FIGS. 2A-7C. Further, some elements that are described in reference to FIGS. 2A-7C are not enumerated (e.g., second conductive layer 725 of FIG. 7A), to focus description on the bias tee 820 and the multiple-ring portion pattern.

The example resonator 800 includes a substrate 805, having a electrically conductive layer 810 disposed on one side of the substrate 805. The electrically conductive layer 810 is disposed in accordance with a pattern that defines a first ring portion 815-1 and a second ring portion 815-2. A first gap 817-1 is defined in the first ring portion 815-1 and a second gap 817-2 is defined in the second ring portion 815-2. A bias tee 820 is electrically coupled with the second ring portion 815-2 via a second input point 825-2. The bias tee 820, the second input point 825-2, and a first input point 825-1 are electrically coupled with respective electrical couplers 830, as described in more detail in reference to FIGS. 2A-2B. The first ring portion 815-1 assumes a non-circular form factor, being a "racetrack" figure defined by a compound curve of electrically conductive material of the first conductive layer 810. Advantageously, such non-circular shapes can improve the performance of one or more of the ring portions 815, for example, by accommodating geometric and fractional position constraints imposed by a physical housing and/or by operating frequency constraints for maintaining one or more resonant modes in the corresponding gap 817.

FIG. 8B illustrates the power systems and switching electronics in the dual-ring configuration of the example resonator 800. The electrical components include an RF power supply 835, coupled with the example resonator 800 via switching circuitry 840, a DC power supply 845, coupled with the example resonator via a bias tee 850. The example resonator 800 is configured to ignite and sustain a discharge in a discharge volume between the substrate 805 and a source electrode 855, from which charged particles can be extracted by an extractor electrode 860, as described in more detail in reference to FIGS. 2A-3B.

Figure 11:
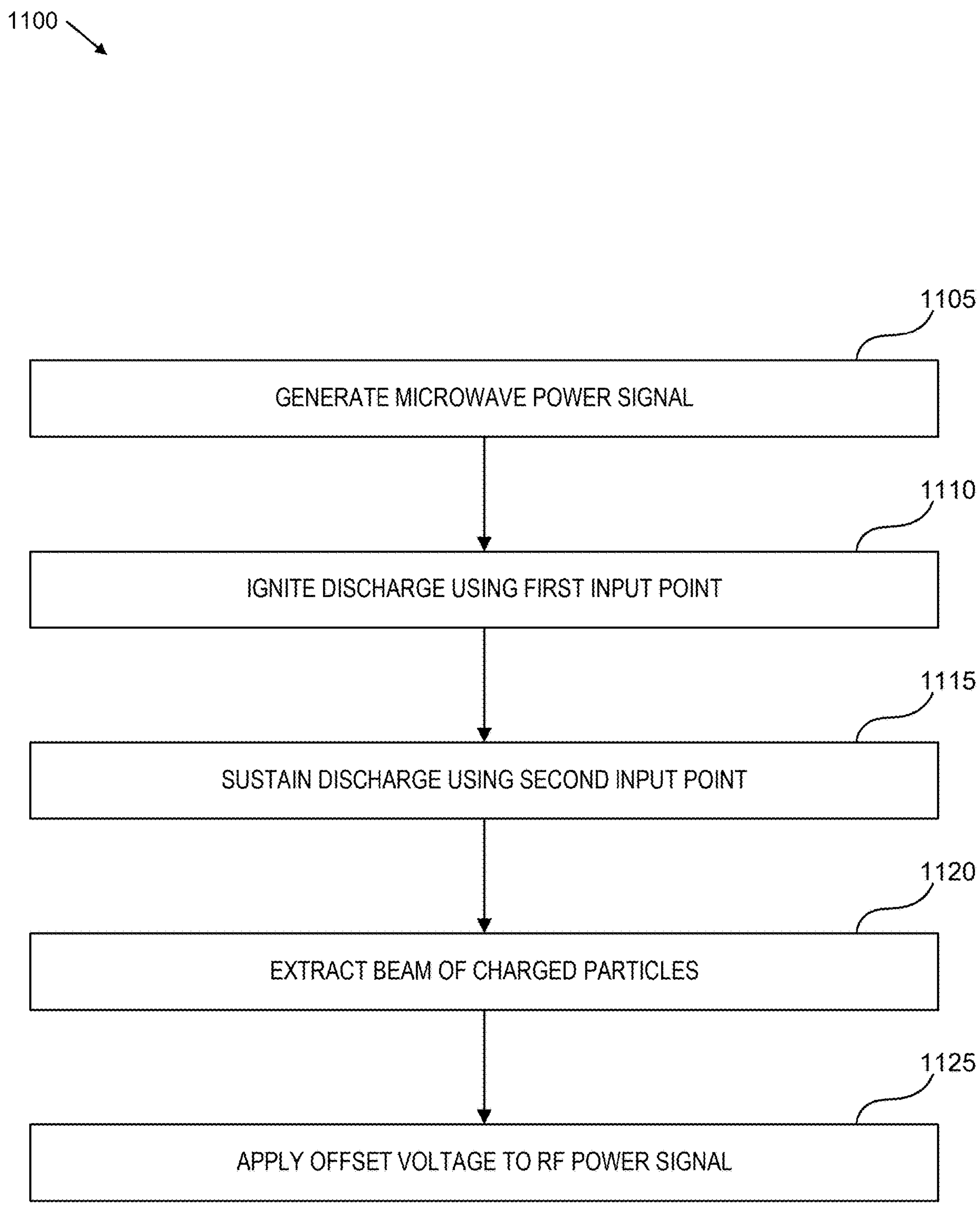
FIG. 11 is a block flow diagram illustrating an example process for extracting an beam of ions from a discharge, in accordance with some embodiments of the present disclosure.

As described in more detail in reference to FIGS. 6A-7C, the switching circuit 840 can be configured to direct an RF power signal to the example resonator 800, switching between the first input point 825-1 and the second input point 825-2, based at least in part on a presence of the discharge in the discharge volume, as described in reference to FIG. 11. To that end, each respective ring portion 815 can be configured to perform a function, such as igniting the discharge in the absence of a discharge, sustaining a discharge in the presence of the discharge, etc, while maintaining a well matched condition with respect to the impedance and reflected power of the discharge circuit, based at least in part on different fractional positions being defined for each ring portion 815. The bias tee 850, in turn, can be configured to modulate a voltage offset of the RF power signal, as an approach to controlling and/or increasing the operating range of charged particle flux drawn by the extraction electrode 860.

FIGS. 9A-9D are schematic diagrams illustrating components of an example resonator 900 representing an embodiment of the ion sources of FIGS. 2A-4C including a single split ring resonator and multiple input points 920, in accordance with some embodiments of the present disclosure. The discussion of the components of example resonator 900 focuses on the patterning of elements of the resonator 900, as well as electrical sub-systems with which it is electrically coupled. To that end, FIGS. 9A-9D omit one or more components of the example ion sources that are discussed in more detail in reference to FIGS. 2A-4C. The example resonator 900 includes a substrate 905. The substrate 905 defines a first side 907 and a second side 909. The example resonator 900 includes a first conductive layer 910 disposed on the first side 907. The first conductive layer 910 is disposed in accordance with a pattern comprising a ring portion 915. The pattern defines multiple input points 920, including a first input point 920-1 and a second input point 920-2. The pattern further defines a gap 925 in the ring portion 915 of the first conductive layer 910. The second side 909 is opposite the first side 907, with respect to two substantially planar faces of the substrate 905. The example resonator 900 includes a second conductive layer 930 disposed on the second side 909.

Advantageously, the multiple-input resonators illustrated in FIGS. 9A-9D can benefit from improved discharge stability and reduced geometric size, by combining the function of multiple ring portions 915 into a single ring portion 915. As with the other embodiments of the present disclosure, the ring portion 915 can be circular or non-circular, based at least in part on space constraints of the charged particle source system into which the example resonator 900 is to be integrated. To that end, the discussion of fractional position provided in reference to FIGS. 5A-8B applies to the locations of the input points 920, relative to the location of the gap 925 on the ring portion 915. For example, the first input point 920-1 can be formed at a first fractional position, $\alpha$, on the ring portion 915. The second input point 920-2 can be formed at a second fraction position, $\beta$, on the ring portion 915. A third input point 920-3 can be formed at a third fractional position, $\gamma$, on the ring portion 915. In some embodiments, $\beta$ is greater than $\alpha$. In some embodiments, $\gamma$ is greater than $\beta$ and $\alpha$.

In this context, different fractional positions can permit the example resonator 900 to operate under different operating regimes, such as pre-ignition in the absence of the discharge, post-ignition in the presence of the discharge, and with diverse discharge mixtures that can present different electronic properties that implicate different RF power signals and different input point 920 positions on the ring portion. Further, the example resonator 900 can be configured, through the fractional position of each respective input point 920, to provide a well-matched impedance condition for each operating mode. In some cases, each mode can be associated with a different RF power signal.

As described in more detail in reference to FIGS. 5A-8B, the example resonator 900 can be configured to ignite and sustain a discharge (e.g., discharge 550 of FIG. 5C) in a vicinity of the gap 925. As described in more detail in reference to FIG. 2A-3B, the example resonator 900 can be electrically coupled with one or more power supply systems, such as the RF power supply 965, the DC power supply 960, or the like, via one or more electrical couplers 935. To that end, the example resonator 900 is illustrated with the input points 920 coupled with control circuitry 955. The control circuitry 955 is configured to adapt and/or modify the operation of the example resonator based at least in part on the ignition of a discharge, as part of maintaining a well-matched condition and/or substantially consistent brightness as a charged particle beam source. To that end, the control circuitry 955, an example of which is illustrated in detail in FIG. 9C, can include one or more sets of electrical components 975, electrically coupled with a DC power supply 960 and configured to react to changes in one or more operating parameters of the example resonator at least in part by modifying which of the input points 920 receives an RF power signal generated by the RF power supply 965.

In the illustrative example of dual-input resonator 970, which is an embodiment of the example resonator 900, the first input point 920-1 and the second input point 920-2 are respectively coupled with the RF power supply 965 via electrical components 975 including a diode (e.g., a PIN diode) and a capacitor, and with the DC power supply via components 975 including a resistor-inductor pair. In some embodiments, the electrical components 975 can include two or more diodes coupled with each input point 920 (e.g., four PIN diodes for the dual-input configuration of FIG. 9C). Similarly, each input point can be coupled with the DC power supply 960 via one or more inductors, resistors, or other electrical components 975. The control circuitry 955, thus configured, can react to a change in reflected power induced by the ignition of a discharge at or near the gap 925 by redirecting an RF power signal from the first input point 920-1 to the second input point 920-2. To that end, the second input point 920-2, being configured as the input point 920 corresponding to the presence of the discharge, is provided with a bias tee, as described in more detail in reference to FIGS. 6A-6C. In the example of the dual-input resonator 970, three DC power supply 960 units are shown, but the system can include more, or fewer (e.g., one DC power supply to bias the resistor-inductor pairs and to apply the voltage offset to the second input point 920-2). To that end, the DC power supply(ies) 960 can include voltage regulating sub-circuits that permit different voltages and/or currents to be outputted to different components 975 and/or input points 920.

The example resonator 900 can be integrated into a charged particle beam system (e.g., as part of the FIB source 110 of FIG. 1), being oriented relative to a source electrode 980 and an extractor electrode 985. The resonator 900, source electrode 980, and extractor electrode 985 being electrically coupled with power circuitry and control circuitry as described in reference to FIGS. 1-8B. In this way, the charged particle beam system can generate a beam of charged particles (e.g., ions) that can be focused onto a sample to generate characteristic data for imaging and/or microanalysis.

FIGS. 10A-10D are schematic diagrams illustrating components of an example resonator 1000 representing an embodiment of the ion sources of FIGS. 2A-4C including a multipole resonant structure, in accordance with some embodiments of the present disclosure. The discussion of the components of example resonator 1000 focuses on the patterning of elements of the resonator 1000. To that end, FIGS. 10A-10D omit one or more components of the example ion sources that are discussed in more detail in reference to FIGS. 2A-9D. The example resonator 1000 includes a substrate 1005. The substrate 1005 defines a first side 1007 and a second side 1009. The example resonator 1000 includes a first conductive layer 1010 disposed on the first side 1007. The first conductive layer 1010 is disposed in accordance with a pattern comprising multiple ring portions 1015. The pattern defines an input point 920 by which the first conductive layer 1010 is coupled with an electrical coupler 1040. The ring portions 1015 are coupled with the input point via respective input traces 1030 at respecting ring junctions 1035. The pattern defines the multiple ring portions 1015 such that a number of gaps 1025 are defined that is double the number of ring portions 1015. In the example resonator 1000, a first ring portion 1015-1 and a second ring portion 1015-2 together define a first gap 1025-1 between a first end 1050-1 and a second end 1050-2 of the first ring portion 1015-1 (see, FIG. 10B), a second gap 1025-2 between the first ring portion 1015-1 and the second ring portion 1015-2, a third gap 1025-3 between a first end 1055-1 and a second end 1055-2 of the second ring portion 1015-2 (see, FIG. 10B), and a fourth gap 1025-4 between the second ring portion 1015-2 and the first ring portion 1015-1. The second side 1009 is opposite the first side 1007, with respect to two substantially planar faces of the substrate 1005. The example resonator 1000 includes a second conductive layer 1045 disposed on the second side 1009.

Without being bound to a particular physical mechanism or principle of operation, dipole-type generator structures of conventional split-ring resonator devices, as opposed to ion sources of the present disclosure, can impose time-varying electric fields at the location from which ions are extracted (e.g., from a vicinity of the gap in a ring structure). A consequence of the imposition of time-varying electric fields is that energy can be transferred from electrons in the discharge to ions in the discharge, as part of a partial thermalization process, in effect, “heating” the ions in the discharge region. While this can be considered beneficial in some ways, for example, by increasing the average energy of ions, which can potentially increase ion flux, the increased ion temperature can also degrade internal structures of the ion source (e.g., through ion bombardment), increase the flux of neutral atoms and/or molecules into the column (e.g., a form of “entrainment”), and can potentially degrade precursors by promoting plasma dissociation mechanisms.

Figure 10A:
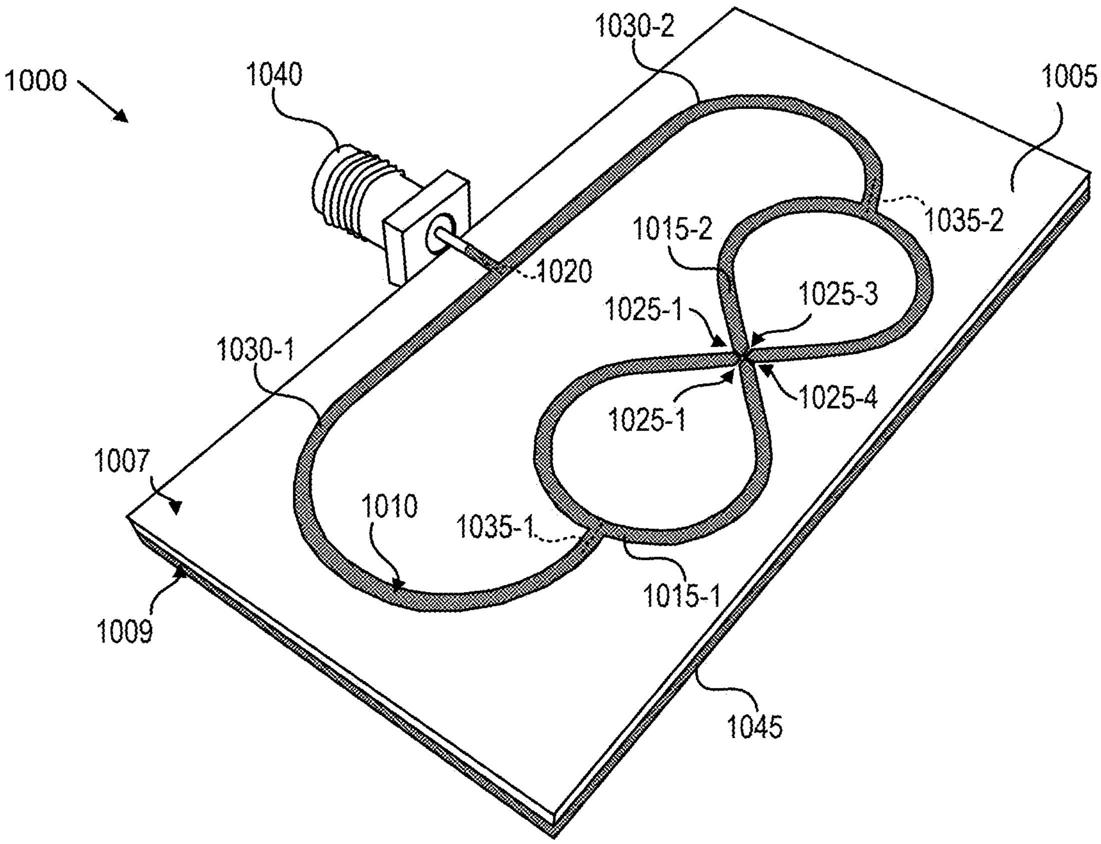
FIGS. 10A-10D are schematic diagrams illustrating an example ion source of FIGS. 2A-3B including a multipole resonant structure, in accordance with some embodiments of the present disclosure.
Figure 10B:
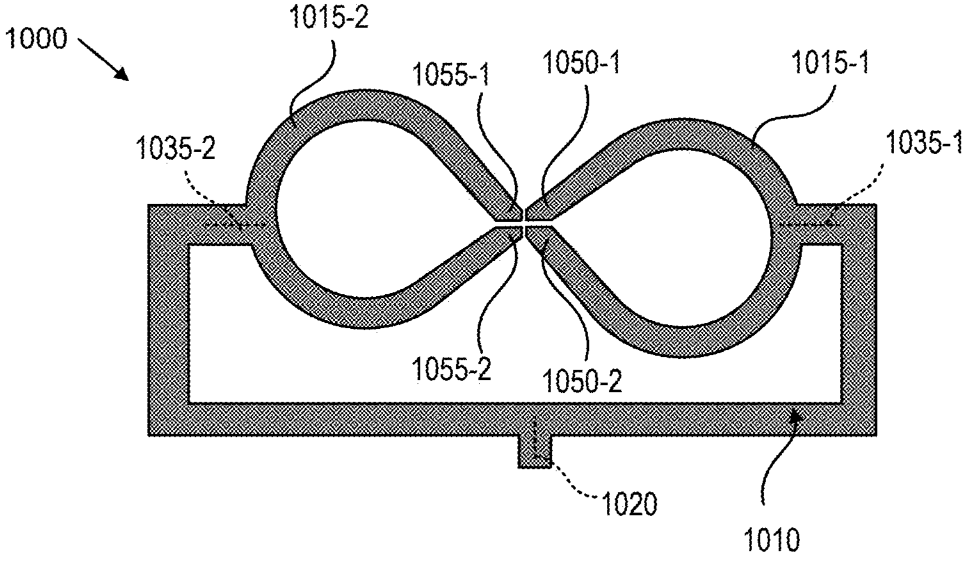
Figure 10C:
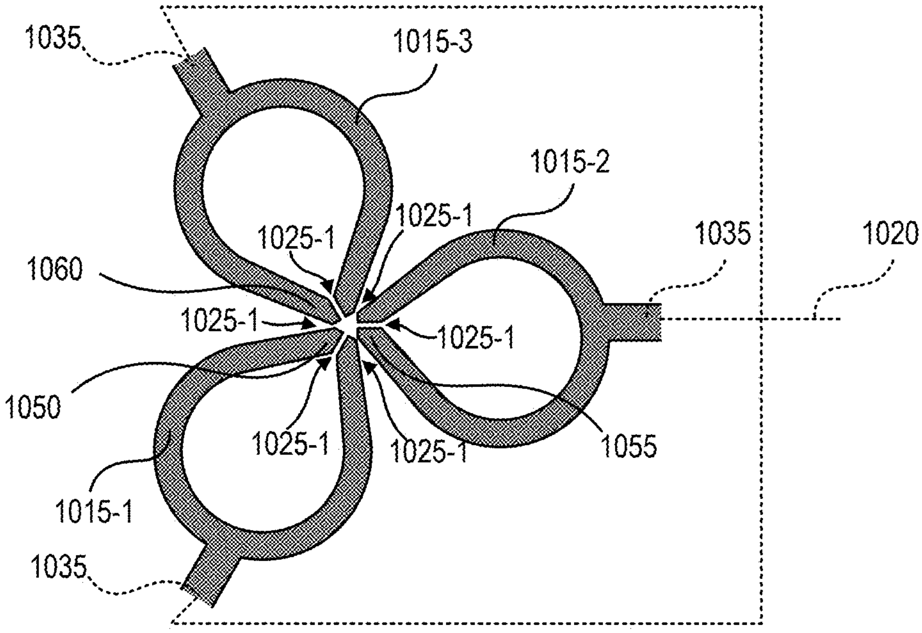
Figure 10D:
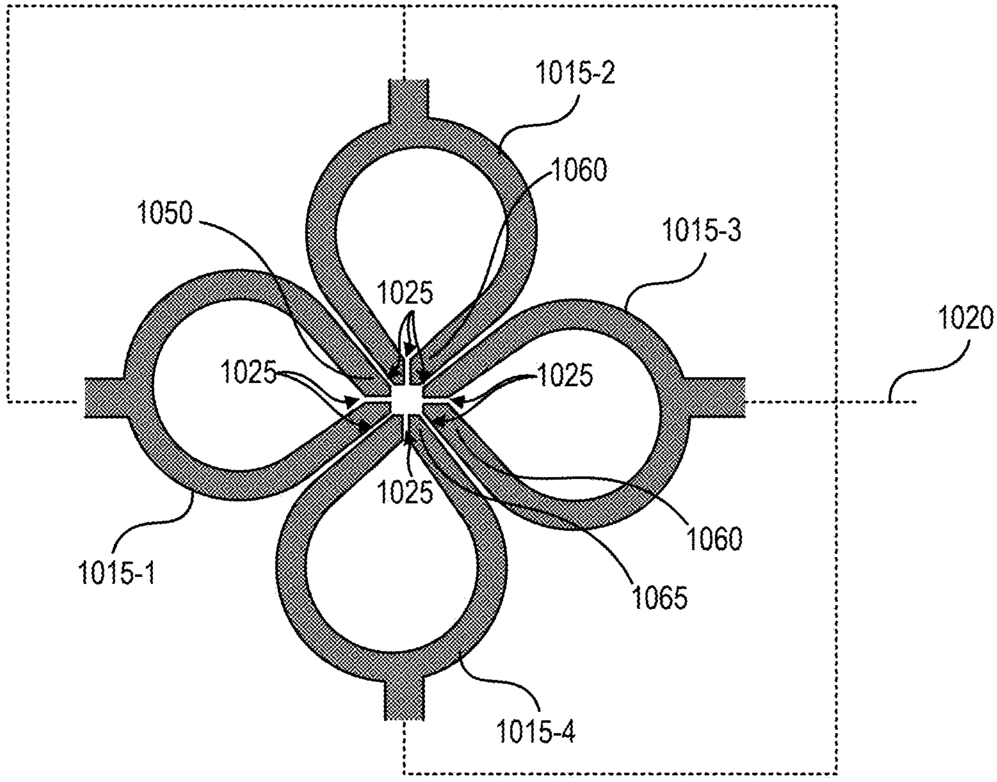

Advantageously, multipole resonators, embodiments of which are shown in FIGS. 10A-10D, can be configured to produce a substantially field-free region within at least a portion of the discharge volume at least in part by generating the discharge between and/or among the multiple ring portions 1015 (e.g., in a vicinity of the multiple gaps 1025). FIGS. 10A-10B illustrate quadrupole embodiments, for which the first conductive layer 1010 is disposed with four ends 1050-1, 1050-2, 1055-1, and 1055-2. FIGS. 10C-10D illustrate hexapole (with three ring portions 1015 and six gaps 1025) and octopole (with four ring portions 1015 and eight gaps 1025) embodiments, respectively, for which the first conductive layer 1010 is disposed with six ends 1050, 1055, 1060, and eight ends 1050, 1055, 1060, and 1065, respectively. The example resonator 1000 can be configured to provide substantially equal voltages at opposing ends of the quadrupole structure (e.g., first end 1050-1 and second end 1055-2) across multiple phases of an alternating current power signal (e.g., the RF power signal). In this way, the electric field at the central location between the ends 1050 and 1055 of the multipole remains substantially zero in the presence of the discharge.

A plasma generation structure whose electric field remains substantially zero at one or more locations in the plasma discharge region, can produce a non-thermal plasma for which an average ion temperature is significantly less than an average electron temperature, at least in part by limiting energy transfer between the ions and the electrons and by limiting the acceleration of ions in the plasma by the electric field in the gap. Maintaining a relatively low average temperature of ions improves FIB source technology, at least in part increasing the brightness of the beam extracted from an ion source. In some cases, reduced ion temperature in the plasma can also narrow the width of the energy distribution in the ion beam, narrow the angular distribution downstream of the extractor electrode (e.g., extractor electrode 233 of FIG. 2A or FIG. 2B, extractor electrode 335 of FIG. 3A or FIG. 3B), and/or limit contamination of the ion beam with material from the ion source itself (e.g., resulting from degradation of structures internal to the source by ion bombardment).

Carefully coordination of the microwave phase and voltage signal between and among the ends of a higher order multipole, a node of zero electric field can be created between the ring portions 1015 (e.g., using a microwave drive frequency from about 1.0 GHz to about 1.5 GHz, including fractions, sub-ranges and interpolations thereof, and drive power from about 0.1 W to about 10 W, including fractions, sub-ranges and interpolations thereof). Such a condition can reduce and/or substantially eliminate transverse heating of ions by electric field acceleration, leaving momentum transfer with electrons and other particles as the principal heating mechanism. With a reduced average temperature of ions in the discharge, resonators of the present disclosure can exhibit improved brightness in a FIB source.

FIG. 11 is a block flow diagram illustrating an example process for extracting an beam of ions from a discharge, in accordance with some embodiments of the present disclosure. One or more operations making up the example process 1100 can be executed by a computer system or other programmable logic machine, operably coupled with components of a charged particle microscope (e.g., charge particle beam system 100 of FIG. 1) and/or additional systems or subsystems including, but not limited to, characterization systems, power supply systems, network infrastructure, databases, and/or user interface devices. To that end, operations of example process 1100 can be stored as machine executable instructions in one or more machine readable media.

One or more operations of the example process 1100 can be repeated, reordered, and/or omitted, for example, as part of extracting a beam of ions from a discharge generated using an ion source of the present disclosure. To that end, the operations of example process 1100 are described as being performed by a system, where it is understood that the operations can include generating and communicating control signals between a processor or other logic circuitry and electronic or electromechanical elements of the charged particle beam system. The operations of example process 1100 are described in the context of an electron microscope in the interest of clarity. Embodiments of the present disclosure include processes for generating monochromated ion beams, as well as other charged particle configurations, such as dual beam systems. The example process 1100 omits one or more operations that can precede and/or follow the operations of example process 1100. For example, operations can include drawing and maintaining a vacuum in a vacuum enclosure (e.g., vacuum enclosure 235 of FIG. 2A) in which an ion source operates. Similarly, operations can include one or more control schemes (e.g., feedback, feed-forward, etc.) by which the systems of the present disclosure can modulate one or more operating parameters of the ion source.

At operation 1105, the example process 1100 includes generating a microwave power signal. Generating the power signal can include operating an RF power supply (e.g., RF power supply 345 of FIG. 3A) as described in reference to the preceding figures. For example, the RF power signal can have a power from about 0.1 W to about 30 W, including fractions, sub-ranges, and interpolations thereof. The RF power signal can have a frequency from about 100 MHz to about 5 GHz, including fractions, sub-ranges, and interpolations thereof. Due at least in part to the highly coupled nature of discharge operation, where multiple physical and electrical phenomena interact to produce a highly nonlinear environment, predictive and/or analytical control schemes can be difficult, if not impossible, to prepare. To that end, while it is generally possible to state that higher power can produce brighter discharges in some circumstances (e.g., one set of operating conditions), the influence of thermalization, plasma density, ionization fraction, etc., can also impair performance at higher power and can contaminate the beam, as described in more detail in reference to FIGS. 10A-10D. Similarly, the resonant modes of the electric field in the gap (e.g., gap 370 of FIG. 3B) are strongly coupled with the geometric pattern by which the first conductive layer (e.g., first conductive layer 320 of FIG. 3B) is defined, such that the operating frequencies can by limited to one or more subranges within which a resonant mode is produced that can ignite and/or sustain the discharge. In some embodiments, a single RF power signal is generated in the presence and in the absence of the discharge. In some embodiments, multiple RF power signals are used, differentiated between the presence of the discharge and the absence of the discharge. In some embodiments, the RF power signal is modulated during one or more operations of example process 1100, for example, as part of a control scheme configured to maintain a substantially constant brightness of the ion source, while maintaining a well-matched condition in the presence and/or in the absence of the discharge.

Figure 9A:
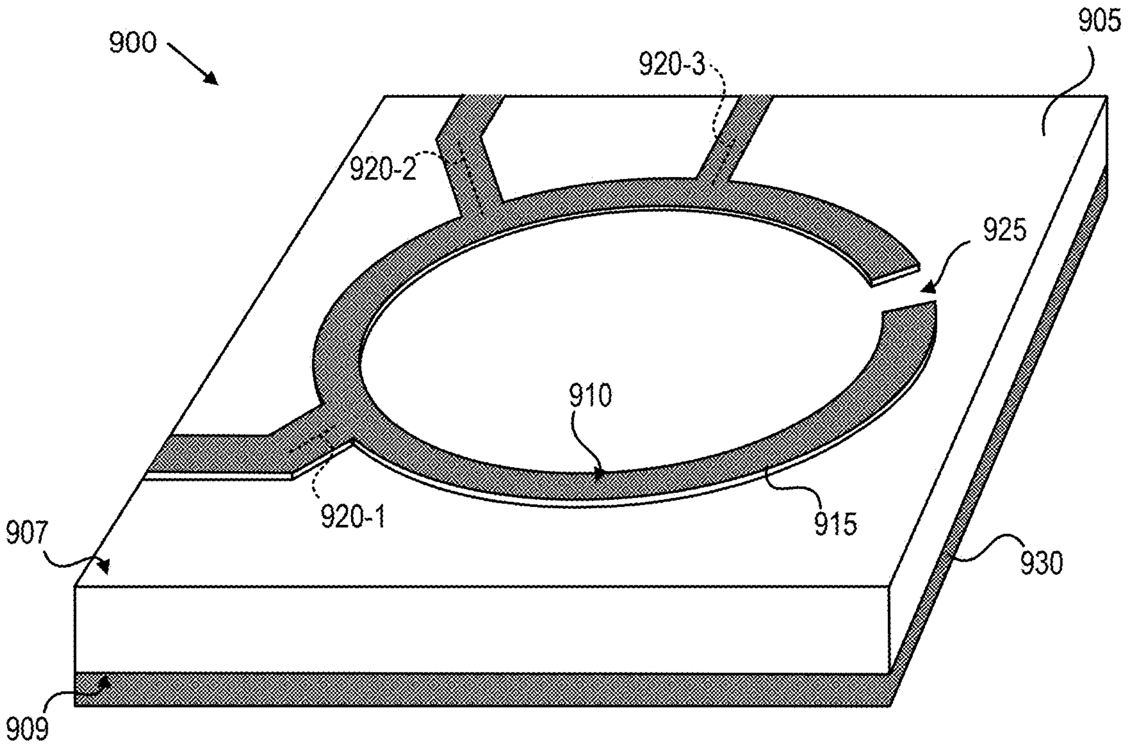
FIGS. 9A-9D are schematic diagrams illustrating an example ion source of FIGS. 2A-3B including multiple input points, in accordance with some embodiments of the present disclosure.
Figure 9B:
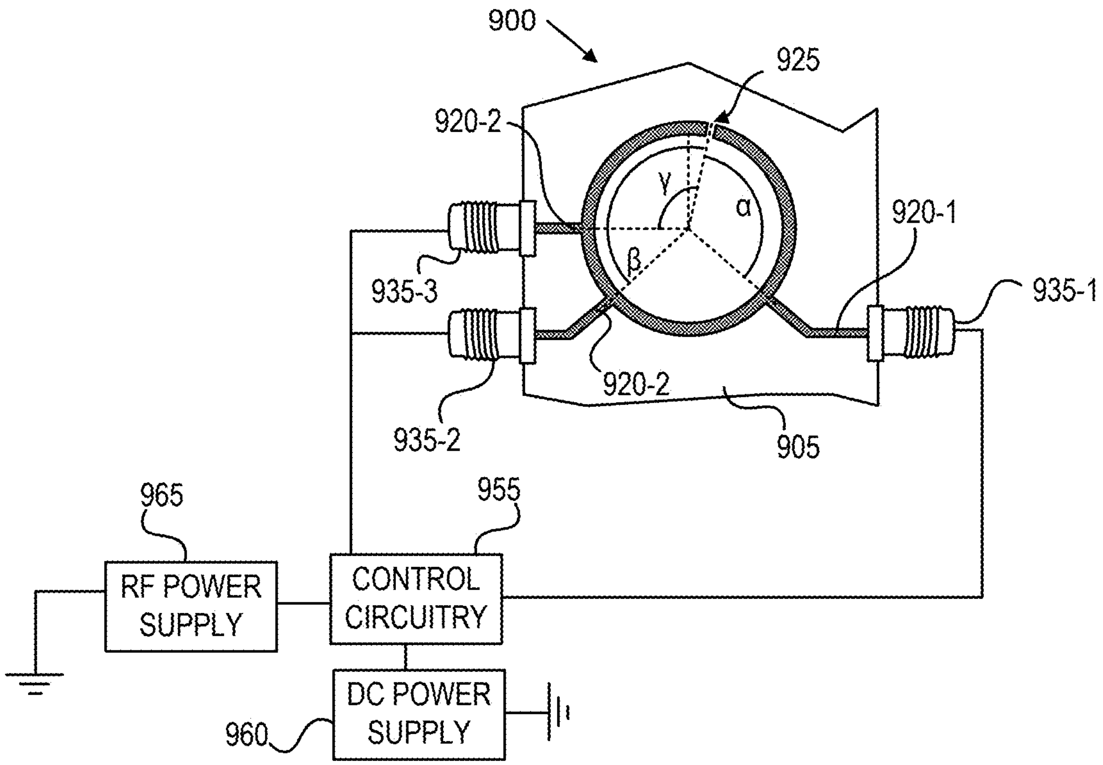
Figure 9C:
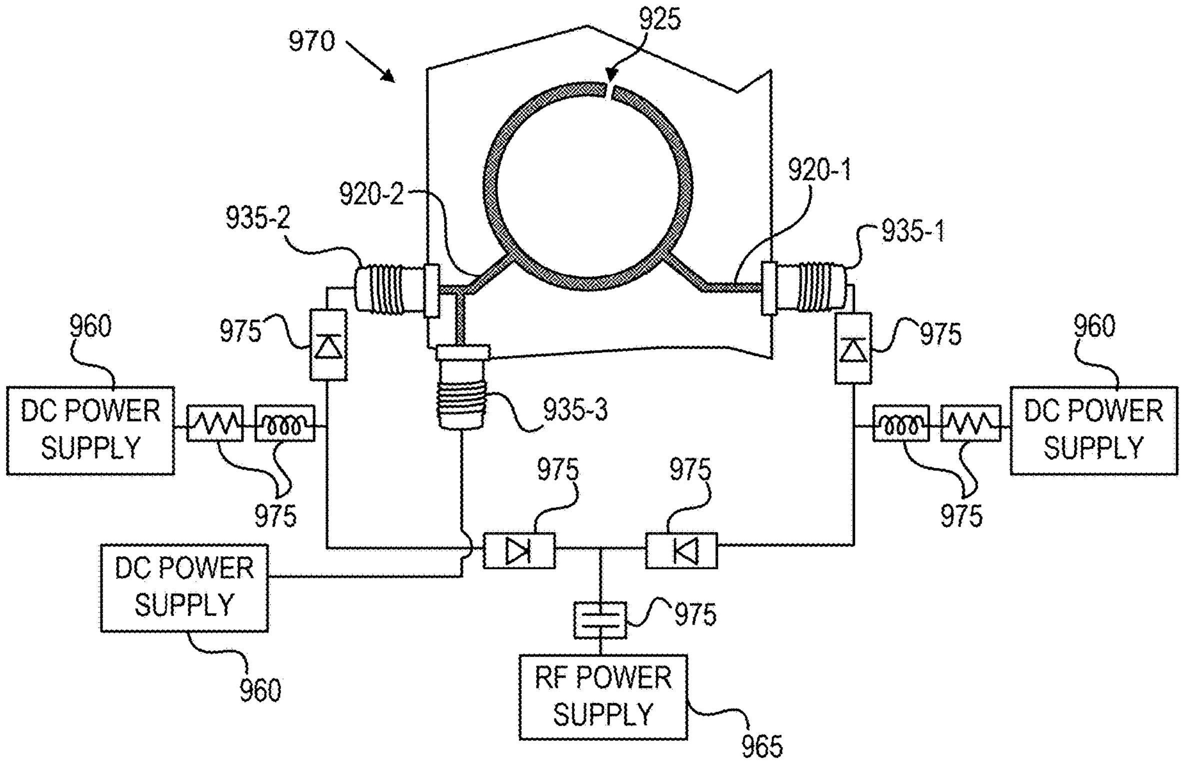
Figure 9D:
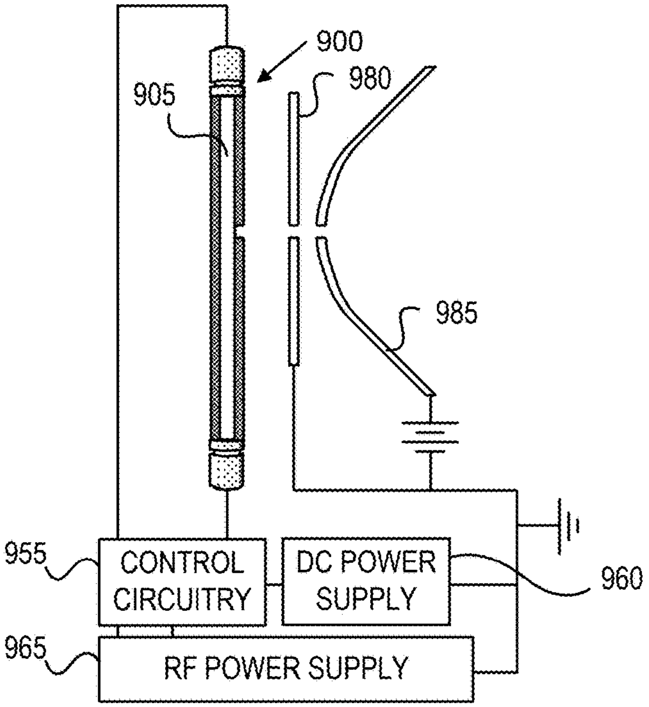

At operation 1110, the example process 1100 includes igniting a discharge using an ignition input point (e.g., first input point 735-1 of FIG. 7A, first input point 825-1 of FIG. 8A, first input point 920-1 of FIG. 9A). Embodiments of the present disclosure include multi-ring, multi-point, and multipole resonators that can include multiple input points at different locations in the first conductive layer. Based at least in part on the identification of an ignition input point (e.g., for the RF power signal in the absence of the discharge) and a maintenance input point (e.g., for the RF power signal in the presence of the discharge), as described in more detail in reference to FIGS. 5A-10D, control and/or switching circuitry (e.g., the switching circuit 755 of FIG. 7C, the switching circuit 840 of FIG. 8B, control circuitry 955 of FIG. 9C, etc.) can be configured to direct the RF power signal generated at operation 1105 toward the ignition input point, up to and until the ignition is detected, for example, as described in more detail in reference to FIG. 9C.

At operation 1115, the example process 1100 includes sustaining the discharge using the maintenance input point (e.g., second input point 735-2 of FIG. 7A, second input point 825-2 of FIG. 8A, second input point 920-2 of FIG. 9A). Embodiments of the present disclosure include control circuitry configured to react to the ignition of the discharge at operation 1110 by redirecting the RF power signal generated at operation 1105 toward the maintenance input point. To reduce the risk of damage based at least in part on reflected power, arising from a poorly matched discharge condition, the response time of the control circuitry can be improved by using power circuits including hardwired components, as described in reference to FIG. 9C. In some embodiments, one or more additional or alternative control schemes are implemented using measured parameters of the ion sources of the present disclosure, with concurrent and/or subsequent computational processes. In an example, a brightness measure, downstream of an extractor electrode (e.g., extractor electrode 335 of FIGS. 3A-3B), can be used to modulate DC offset voltage and or RF power, but can also be used to identify when a discharge is present. In this way, measurement and computation can be used with or instead of the circuit element-based techniques described in reference to FIG. 9C.

At operation 1120, the example process 1100 includes extracting a beam of charged particles. In some embodiments, extracting the beam of charged particles can include energizing the extractor electrode to draw (e.g., by electrostatic attraction) charged particles from the discharge, via an aperture (e.g., aperture 265 of FIG. 2B, aperture 331 of FIGS. 3A-B) in a source electrode making up part of the ion source. These principles are described in more detail in reference to FIGS. 2A-3B. Energizing the extractor electrode can include applying a DC voltage to the electrode, as described in reference to FIGS. 5C-9D, but can also include applying an AC or intermittent voltage to the extraction electrode (e.g., as part of a pulsing scheme).

At operation 1125, the example process 1100 includes applying an offset voltage to the RF power signal. The offset voltage can be applied using a bias tee (e.g., bias tec 640 of FIGS. 6A-6C), as described in more detail in reference to FIGS. 6A-6C, 8A-8C, and 9C). The offset voltage can afford an additional control parameter by which the brightness of the ion sources of the present disclosure can be modulated, with little to no influence on the matching condition of the discharge circuit. Embodiments of the present disclosure include an offset voltage being applied to the power signals being applied as part of operation 1110 and operation 1115 (e.g., in the presence and in the absence of the discharge). To that end, an offset voltage can assist in igniting the discharge, as well as or instead of being used to modulate the discharge following ignition.

In the preceding description, various embodiments have been described. For purposes of explanation, specific configurations and details have been set forth in order to provide a thorough understanding of the embodiments. However, it will also be apparent to one skilled in the art that the embodiments may be practiced without the specific details. Furthermore, well-known features may have been omitted or simplified in order not to obscure the embodiment being described. While example embodiments described herein center on charged particle beam systems, and dual-beam FIB systems in particular, these are meant as non-limiting, illustrative embodiments. Embodiments of the present disclosure address analytical instruments systems for which a wide array of material samples can be analyzed to determine chemical, biological, physical, structural, or other properties, among other aspects, including but not limited to chemical structure, trace element composition, or the like. Further, embodiments of the present disclosure can be applied in systems configured for automated (e.g., performing one or more processes or operations without human involvement), pseudo-automated (e.g., performing one or more processes or operations with limited human involvement and/or with human initiation), and/or manual processes or operations for sample preparation (e.g., in lamella preparation) workflows, for example, as would be used in metrology of semiconductor samples.

Some embodiments of the present disclosure include a system including one or more data processors and/or logic circuits. In some embodiments, the system includes a non-transitory computer readable storage medium containing instructions which, when executed on the one or more data processors and/or logic circuits, cause the one or more data processors and/or logic circuits to perform part or all of one or more methods and/or part or all of one or more processes and workflows disclosed herein. Some embodiments of the present disclosure include a computer-program product tangibly embodied in non-transitory machine-readable storage media, including instructions configured to cause one or more data processors and/or logic circuits to perform part or all of one or more methods and/or part or all of one or more processes disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the claims. Thus, it should be understood that although the present disclosure includes specific embodiments and optional features, modification and variation of the concepts herein disclosed may be resorted to by those skilled in the art, and that such modifications and variations are considered to be within the scope of the appended claims.

Where terms are used without explicit definition, it is understood that the ordinary meaning of the word is intended, unless a term carries a special and/or specific meaning in the field of charged particle microscopy systems or other relevant fields. The terms "about" or "substantially" are used to indicate a deviation from the stated property within which the deviation has little to no influence of the corresponding function, property, or attribute of the structure being described. In an illustrated example, where a dimensional parameter is described as "substantially equal" to another dimensional parameter, the term "substantially" is intended to reflect that the two parameters being compared can be unequal within a tolerable limit, such as a fabrication tolerance or a confidence interval inherent to the operation of the system. Similarly, where a geometric parameter, such as an alignment or angular orientation, is described as "about" normal, "substantially" normal, or "substantially" parallel, the terms "about" or "substantially" are intended to reflect that the alignment or angular orientation can be different from the exact stated condition (e.g., not exactly normal) within a tolerable limit. For numerical values, such as diameters, lengths, widths, or the like, the term "about" can be understood to describe a deviation from the stated value of up to ±10%. For example, a dimension of "about 10 mm" can describe a dimension from 9 mm to 11 mm.

The description provides exemplary embodiments, and is not intended to limit the scope, applicability or configuration of the disclosure. Rather, the ensuing description of the exemplary embodiments will provide those skilled in the art with an enabling description for implementing various embodiments. It is understood that various changes may be made in the function and arrangement of elements without departing from the spirit and scope as set forth in the appended claims. Specific details are given in the description to provide a thorough understanding of the embodiments. However, it will be understood that the embodiments may be practiced without these specific details. For example, specific system components, systems, processes, and other elements of the present disclosure may be shown in schematic diagram form or omitted from illustrations in order not to obscure the embodiments in unnecessary detail. In other instances, well-known circuits, processes, components, structures, and/or techniques may be shown without unnecessary detail.

What is claimed is:

1. A charged particle source, comprising:

a resonator, including:

a dielectric substrate defining a first side and a second side, the second side opposite the first side;

a first conductive layer disposed on the first side, the first conductive layer disposed in accordance with a pattern comprising a ring portion, the pattern defining:

a gap in the ring portion of the first conductive layer;

a first input point in the ring portion at a first fractional position, α, on the ring portion; and a second input point in the ring portion at a second fractional position, β, on the ring portion; and a second conductive layer disposed on the second side; and a source electrode, disposed proximal to the first side, the source electrode defining an aperture, the source electrode being offset from the first conductive layer, wherein, for a given input point in the ring portion, the fractional position is a ratio of a first path length between the gap and the given input point in a first direction, relative to a second path length between the gap and the given input point in a second direction different from the first direction.

2. The charged particle source of claim 1, further comprising:

a radio frequency (RF) power supply, operatively coupled with the resonator, wherein a first conductive path from the RF power supply through the first input point is well-matched in an absence of a discharge, wherein a second conductive path from the RF power supply through the second input point is well-matched in a presence of the discharge, and wherein well-matched refers to a condition of negligible or substantially no reflected power being measured at the RF power supply during operation.

3. The charged particle source of claim 2, further comprising control circuitry configured to deliver power from the RF power supply to the first input point or the second input point, based at least in part on an ignition of the discharge between the ring portion and the source electrode.

4. The charged particle source of claim 3, wherein:

β is less than α; and the source is configured to deliver RF power to the ring portion via the first input point in the absence of the discharge and via the second input point in the presence of the discharge.

5. The charged particle source system of claim 3, wherein the control circuitry comprises:

a first diode electrically coupled with the ring portion via the first conductive path;

a second diode electrically coupled with the ring portion via the second conductive path; and a DC voltage source electrically coupled with the first conductive path via a first inductor or electrically coupled with the second conductive path via a second inductor.

6. The charged particle source system of claim 1, wherein the pattern further defines a third input point on the ring portion, between the first input point and the second input point and at third fractional position, γ, relative to the gap.

7. The charged particle source of claim 1, further comprising a DC bias tee, electrically coupled with the first conductive layer, the DC bias tee comprising a DC power input and an RF power input and comprising components configuring the DC bias tee to apply a DC bias to an RF power signal, thereby modifying an offset voltage of the RF power signal.

8. The charged particle source of claim 1, wherein the source electrode is electrically coupled to a reference voltage common with the second conductive layer.

9. The charged particle source of claim 1, being operably coupled with a focused ion beam (FIB) column, wherein an extractor electrode is disposed on a beam axis downstream of the source electrode.

10. The charged particle source of claim 1, further comprising a source assembly, the source assembly comprising:

a fluid delivery coupler;

a fluid removal coupler; and an electrical coupler, wherein the resonator is disposed in the source assembly and operably coupled with the electrical coupler.

11. The charged particle source of claim 10, wherein the source electrode forms a part of the source assembly.

12. The charged particle source of claim 10, further comprising:

a vacuum enclosure;

an isolating support, disposed in the vacuum enclosure, mechanically coupled with the vacuum enclosure and the source assembly and together defining a source chamber and a FIB chamber, the isolating support comprising a material having electrically insulating properties up to and including at an applied voltage of about ±300 kV DC, wherein the source chamber is fluidically coupled with the FIB chamber via a bypass conduit.

13. A charged particle beam system, comprising:

a source section, including:

a resonator, including:

a dielectric substrate defining a first side and a second side, the second side opposite the first side;

a first conductive layer disposed on the first side, the first conductive layer disposed in accordance with a pattern comprising a ring portion, the pattern defining:

a gap in the ring portion;

a first input point in the ring portion at a first fractional position, α, relative to the gap; and a second input point in the ring portion at a second fractional position, β, relative to the gap; and a second conductive layer disposed on the second side; and a source electrode, disposed proximal to the first side, the source electrode; defining an aperture, the source electrode being offset from the first conductive layer;

a focused ion beam (FIB) column, operably coupled with the source section and including multiple charged particle optics; and a vacuum chamber, operably coupled with the FIB column.

14. The system of claim 13, further comprising:

a radio frequency (RF) power supply, operatively coupled with the first conductive layer, wherein a first conductive path from the RF power supply through the first input point is well-matched in an absence of a discharge, wherein a second conductive path from the RF power supply through the second input point is well-matched in a presence of the discharge, and wherein well-matched refers to a condition of negligible or substantially no reflected power being measurable at the RF power supply during operation of the RF power supply.

15. The system of claim 14, further comprising control circuitry configured to deliver power from the RF power supply to the first input point or the second input point, based at least in part on an ignition of the discharge between the ring portion and the source electrode.

16. The system of claim 15, wherein the control circuitry comprises:

a first diode being electrically coupled with the ring portion via the first conductive path;

a second diode being electrically coupled with the ring portion via the second conductive path;

a third diode being electrically coupled with the first diode and the first inductor via the first conductive path;

a fourth diode being electrically coupled with the second diode and the second inductor via the second conductive path; and a DC voltage source electrically coupled with the first conductive path via a first inductor or electrically coupled with the second conductive path via a second inductor.

17. The system of claim 16, wherein the first diode, the second diode, the third diode, and the fourth diode are PIN diodes, the first and third diode being directionally opposed and the second and fourth diodes being directionally opposed.

18. The system of claim 13, wherein:

$\beta$ is less than $\alpha$; and the system is configured to deliver RF power to the ring portion via the first input point in an absence of the discharge and via the second input point in the presence of the discharge.

19. The system of claim 13, wherein the first fractional position a configures the resonator to ignite a discharge in a gas, in accordance with a given RF power signal being applied at the first input point via the first conductive path.

20. The system of claim 13, further comprising a source assembly, the source assembly comprising:

a fluid delivery coupler;

a fluid removal coupler; and an electrical coupler, wherein the resonator is disposed in the source assembly and operably coupled with the electrical coupler, and wherein the source electrode forms a part of the source assembly.

* * * * *